US012236137B2

(12) United States Patent
Chung

(10) Patent No.: US 12,236,137 B2
(45) Date of Patent: Feb. 25, 2025

(54) MEMORY DEVICE INCLUDING A PLURALITY OF PLANES

(71) Applicant: SK hynix Inc., Gyeonggi-do (KR)

(72) Inventor: Seung Hyun Chung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 73 days.

(21) Appl. No.: 18/189,210

(22) Filed: Mar. 24, 2023

(65) Prior Publication Data

US 2024/0168680 A1    May 23, 2024

(30) Foreign Application Priority Data

Nov. 18, 2022  (KR) .......................... 10-2022-0155120

(51) Int. Cl.
*G06F 3/06* (2006.01)

(52) U.S. Cl.
CPC .......... *G06F 3/0659* (2013.01); *G06F 3/0604* (2013.01); *G06F 3/0673* (2013.01)

(58) Field of Classification Search
CPC .... G06F 3/0659; G06F 3/0604; G06F 3/0673; G06F 3/0679; G11C 16/08; G11C 8/12; G11C 16/0483; G11C 16/32
See application file for complete search history.

(56) References Cited

U.S. PATENT DOCUMENTS

| | | | |
|---|---|---|---|
| 7,920,423 B1 | 4/2011 | Ma et al. | |
| 10,380,350 B1* | 8/2019 | Ben Porath | G06F 11/3684 |
| 2009/0244975 A1* | 10/2009 | Kang | G11C 29/832 |
| | | | 365/185.11 |
| 2015/0052265 A1* | 2/2015 | Bakke | G06F 12/0866 |
| | | | 710/5 |
| 2020/0090754 A1* | 3/2020 | Asaoka | G11C 8/12 |
| 2020/0167307 A1* | 5/2020 | Okada | G06F 9/06 |

FOREIGN PATENT DOCUMENTS

KR    10-2021-0019874 A    2/2021

* cited by examiner

*Primary Examiner* — Charles Rones
*Assistant Examiner* — Jonah C Krieger
(74) *Attorney, Agent, or Firm* — IP & T GROUP LLP

(57) ABSTRACT

A memory device comprises: N planes each including a plurality of memory cells, a signal generation block suitable for: selecting a control code corresponding to a selection signal from N control codes respectively corresponding to the N planes, and generating an operation control signal by decoding the selected control code, N operation performing blocks each suitable for performing a predefined operation on a corresponding plane of the N planes according to a value of the operation control signal, a signal transmission block suitable for transmitting the operation control signal to one of the N operation performing blocks through a path corresponding to the selection signal among N paths that connect the signal generation block to the respective N operation performing blocks, and a selection control block suitable for generating the selection signal in response to an input command, an input address and an input clock.

13 Claims, 8 Drawing Sheets

MEMORY DEVICE INCLUDING A PLURALITY OF PLANES

CROSS-REFERENCE TO RELATED APPLICATION(S)

The present application claims priority under 35 U.S.C. § 119(a) to Korean Patent Application No. 10-2022-0155120, filed on Nov. 18, 2022, the disclosure of which is incorporated herein by reference in its entirety.

BACKGROUND

1. Field

Various embodiments of the present disclosure generally relate to a storage device, and particularly, to a memory device including a plurality of planes.

2. Description of the Related Art

Memory systems are storage devices embodied using a semiconductor such as silicon (Si), germanium (Ge), gallium arsenide (GaAs), indium phosphide (InP), or the like. The memory systems are classified into a volatile memory device and a nonvolatile memory device. The volatile memory device is a memory device in which data stored therein is lost when power supply is interrupted. Representative examples of the volatile memory device include static RAM (SRAM), dynamic RAM (DRAM), synchronous DRAM (SDRAM), etc. The nonvolatile memory device is a memory device in which data stored therein is retained even when power supply is interrupted. Representative examples of the nonvolatile memory device include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc.

A non-volatile memory device may include memory cells, and perform a program operation to store data in the memory cells, a read operation to output the stored data and an erase operation to erase the stored data.

A non-volatile memory device may include a plurality of planes. Each of the plurality of planes may include a plurality of memory blocks. Each of the plurality of memory blocks may include a plurality of pages. Each of the plurality of pages may include a plurality of memory cells.

Herein, one memory block may be understood as a group of memory cells from which data are erased together through the erase operation. One page may be understood as a group of memory cells from which data are outputted together through the read operation or in which data are stored together through the program operation.

The erase operation, the read operation or the program operation may be independently performed on one plane and another plane included in a memory device. For example, during a period in which the erase operation is performed on one plane, the program operation may be performed on another plane.

Accordingly, when a plurality of planes are included in a memory device, a plurality of control logics for controlling operations of the plurality of planes, respectively, may be included in the memory device.

SUMMARY

Various embodiments of the present disclosure are directed to a memory device capable of minimizing a physical area occupied in the memory device by control logics for independently controlling operations of a plurality of planes, respectively, included in the memory device.

An aspect of an embodiment in the present disclosure, a memory device may include: N planes each including a plurality of memory cells; a signal generation block suitable for: selecting a control code corresponding to a selection signal from N control codes respectively corresponding to the N planes, and generating an operation control signal by decoding the selected control code; N operation performing blocks each suitable for performing a predefined operation on a corresponding plane of the N planes according to a value of the operation control signal; a signal transmission block suitable for transmitting the operation control signal to one of the N operation performing blocks through a path corresponding to the selection signal among N paths that connect the signal generation block to the respective N operation performing blocks; and a selection control block suitable for generating the selection signal in response to an input command, an input address and an input clock. "N" may be a natural number equal to or greater than 2.

An aspect of an embodiment in the present disclosure, a memory device may include: a signal generating circuit configured to generate a sequence of control signals according to edges of a clock; and operation circuits configured to perform operations on memory cell groups in response to the control signals, respectively.

These technical problems to be addressed by the present disclosure are not limited to those described above, and other technical problems not described will be apparently understood by those skilled in the art, to which the present disclosure pertains, from the following description.

DETAILED DESCRIPTION

Figure 1:
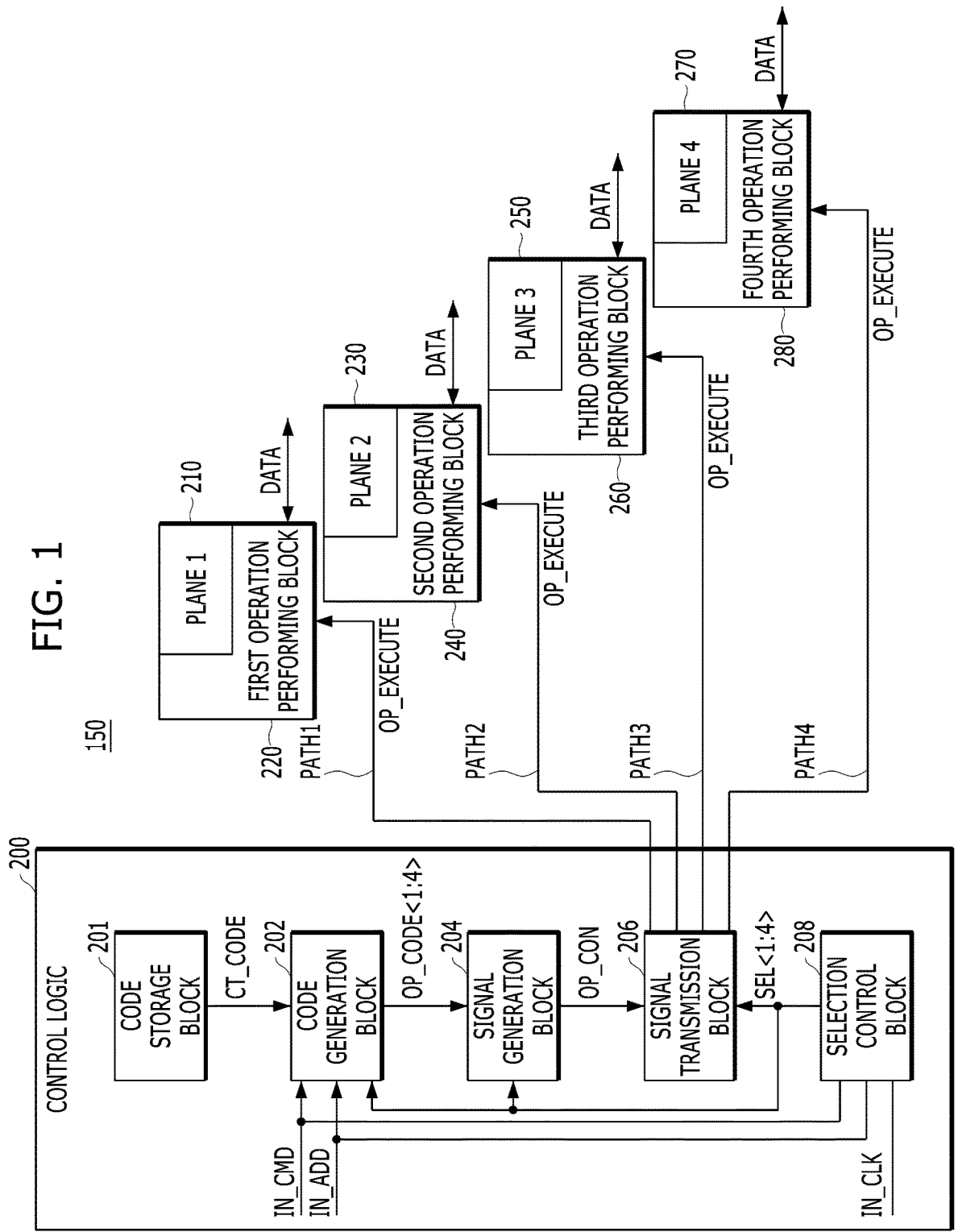
FIG. 1 is a diagram illustrating a memory device including a control logic in accordance with an embodiment of the present disclosure.

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language includes hardware—for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that implement or perform one or more tasks.

As used in this disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or a portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that the terms precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. For example, the phrase "determine 'A' based on 'B'." While in this case, 'B' is a factor that affects the determination of 'A', such a phrase does not foreclose the determination of 'A' from also being based on 'C'. In other instances, 'A' may be determined based solely on 'B'.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

FIG. 1 is a diagram illustrating a memory device 150 including a control logic 200 in accordance with an embodiment of the present disclosure.

Referring to FIG. 1, the control logic 200 included in the memory device 150 in accordance with the present embodiment may include a code generation block 202, a signal generation block 204, a signal transmission block 206 and a selection control block 208. In addition, the memory device 150 may include a plurality of operation performing blocks 220, 240, 260 and 280 for controlling operations of a plurality of planes 210, 230, 250 and 270, respectively, according to an operation of the control logic 200. The control logic 200 may be connected to the plurality of operation performing blocks 220, 240, 260 and 280 through a plurality of paths PATH<1:4>, respectively.

The number of the operation performing blocks 220, 240, 260 and 280 and the number of the paths PATH<1:4> may be determined depending on the number of the planes 210, 230, 250 and 270 included in the memory device 150. For example, when four planes 210, 230, 250 and 270 are included in the memory device 150 as illustrated in FIG. 1, four operation performing blocks 220, 240, 260 and 280 and four paths PATH<1:4> may be included in the memory device 150.

For reference, FIG. 1 illustrates that the four planes 210, 230, 250 and 270 are included in the memory device 150, but this is merely an embodiment, and in actuality, more or fewer planes may be included in one memory device. In the following description, the four planes 210, 230, 250 and 270 are included in the memory device 150.

Specifically, the selection control block 208 may generate selection signals SEL<1:4> in response to an input command IN_CMD, an input address IN_ADD and an input clock IN_CLK.

According to an embodiment, the selection control block 208 may be enabled in response to the input command IN_CMD and the input address IN_ADD, which correspond to one of the plurality of planes 210, 230, 250 and 270, being applied, and in the enabled state, the selection control block 208 may generate the selection signals SEL<1:4> in response to the input clock IN_CLK.

According to an embodiment, when the input command IN_CMD and the input address IN_ADD are not applied during a predetermined time in the enabled state of the selection control block 208, the selection control block 208 may be disabled. In this case, the predetermined time may be defined depending on the toggling number of the input clock IN_CLK. For example, when the input command IN_CMD and the input address IN_ADD are not applied until the input clock IN_CLK repeatedly toggles 600 times from a point in time at which the selection control block 208 enters the enabled state, the selection control block 208 may be disabled.

According to an embodiment, the selection control block 208 may be disabled in response to a specific input command IN_CMD for disabling the selection control block 208 in the enabled state.

The selection control block 208 may not generate the selection signals SEL<1:4> in the disabled state.

More specifically, the selection signals SEL<1:4> may include a plurality of selection values SEL<1>, SEL<2>, SEL<3> and SEL<4>. The number of the selection values SEL<1>, SEL<2>, SEL<3> and SEL<4> included in the selection signals SEL<1:4> may be determined depending on the number of the planes 210, 230, 250 and 270 included in the memory device 150. For example, since the four planes 210, 230, 250 and 270 are included in the memory device 150, four selection values SEL<1>, SEL<2>, SEL<3> and SEL<4> may be included in the selection signals SEL<1:4>.

According to an embodiment, the selection signals SEL<1:4> may include two bit data, and be separated by the four selection values SEL<1>, SEL<2>, SEL<3> and SEL<4> through combinations 00, 01, 10 and 11 of the two bit data. According to another embodiment, the selection signals SEL<1:4> may include four bit data, and the four bit data may correspond to the four selection values SEL<1>, SEL<2>, SEL<3> and SEL<4>, respectively.

More specifically, in the enabled state, the selection control block 208 may activate one of the plurality of selection values SEL<1>, SEL<2>, SEL<3> and SEL<4> and deactivate the other selection values, each point in time at which a predetermined logic level of the input clock IN_CLK starts. On the other hand, in the disabled state, the selection control block 208 may not activate all of the plurality of selection values SEL<1>, SEL<2>, SEL<3> and SEL<4> regardless of the toggling of the input clock IN_CLK.

The point in time at which the predetermined logic level of the input clock IN_CLK starts may refer to one of a rising edge and a falling edge of the input clock IN_CLK. For example, when the predetermined logic level refers to a logic high level, the point in time at which the predetermined logic level of the input clock IN_CLK starts may refer to the rising edge of the input clock IN_CLK. On the contrary, the predetermined logic level refers to a logic low level, the point in time at which the predetermined logic level of the input clock IN_CLK starts may refer to the falling edge of the input clock IN_CLK. In the following description, the point in time at which the predetermined logic level of the input clock IN_CLK starts is the rising edge of the input clock IN_CLK.

According to an embodiment, in the enabled state, the selection control block 208 may activate the first selection value SEL<1> of the plurality of selection values SEL<1>, SEL<2>, SEL<3> and SEL<4> and deactivate the other second to fourth selection values SEL<2>, SEL<3> and SEL<4>, from a first rising edge of the input clock IN_CLK to a second rising edge of the input clock IN_CLK. Subsequently, in the enabled state, the selection control block 208 may activate the second selection value SEL<2> of the plurality of selection values SEL<1>, SEL<2>, SEL<3> and SEL<4> and deactivate the other first, third and fourth selection values SEL<1>, SEL<3> and SEL<4>, from the second rising edge of the input clock IN_CLK to a third rising edge of the input clock IN_CLK. Subsequently, in the enabled state, the selection control block 208 may activate the third selection value SEL<3> of the plurality of selection values SEL<1>, SEL<2>, SEL<3> and SEL<4> and deactivate the other first, second and fourth selection values SEL<1>, SEL<2> and SEL<4>, from the third rising edge of the input clock IN_CLK to a fourth rising edge of the input clock IN_CLK. Subsequently, in the enabled state, the selection control block 208 may activate the fourth selection value SEL<4> of the plurality of selection values SEL<1>, SEL<2>, SEL<3> and SEL<4> and deactivate the other first to third selection values SEL<1>, SEL<2> and SEL<3>, from the fourth rising edge of the input clock IN_CLK to a fifth rising edge of the input clock IN_CLK. Subsequently, in the enabled state, the selection control block 208 may activate the first selection value SEL<1> of the plurality of selection values SEL<1>, SEL<2>, SEL<3> and SEL<4> and deactivate the other second to fourth selection values SEL<2>, SEL<3> and SEL<4>, from the fifth rising edge of the input clock IN_CLK to a sixth rising edge of the input clock IN_CLK. In this way, in the enabled state, the selection control block 208 may repeatedly perform an operation of sequentially activating the plurality of selection values SEL<1>, SEL<2>, SEL<3> and SEL<4> for each rising edge of the input clock IN_CLK.

A code storage block 201 included in the control logic 200 may store source codes for controlling orders and points in time of performance of operations, such as read, program and erase operations, that may be performed by the memory device 150. In this case, values of the source codes stored in the code storage block 201 may be determined in advance in the process of designing the memory device 150. In addition, the values of the source codes stored in the code storage block 201 may vary depending on a type of the memory device 150, an environment in which the memory device 150 is mounted or a performance condition of the memory device 150.

The plurality of planes 210, 230, 250 and 270 included in one memory device 150 may share and use the values of the source codes stored in the code storage block 201. For example, the source code for controlling the performance of the read operation among the source codes stored in the code storage block 201 may be used to control the performance of the read operation on the first plane 210, and simultaneously be used to control the performance of the read operation on the second plane 230. Similarly, the source code for controlling the performance of the program operation among the source codes stored in the code storage block 201 may be used to control the performance of the program operation on the third plane 250, and simultaneously be used to control the performance of the program operation on the fourth plane 270.

For reference, the code storage block 201 may include a memory area having non-volatile characteristics, and store the source codes for controlling the operations of the memory device 150 in the non-volatile memory area. For example, the code storage block 201 may include a read only memory (ROM) as the memory area having non-volatile characteristics.

The code generation block 202 included in the control logic 200 may read the source codes stored in the code storage block 201, according to the selection signals SEL<1:4>, the input command IN_CMD and the input address IN_ADD, and generate a plurality of control codes OP_CODE<1:4>. That is, the code generation block 202 may read the source codes stored in the code storage block 201, according to the input command IN_CMD and the input address IN_ADD of a plane corresponding to a selection value which is activated among the plurality of selection values SEL<1>, SEL<2>, SEL<3> and SEL<4> included in the selection signals SEL<1:4>, and generate one of the plurality of control codes OP_CODE<1:4>. In this case, the number of the plurality of control codes OP_CODE<1:4> generated by the code generation block 202 may be determined depending on the number of planes 210, 230, 250 and 270 included in the memory device 150. For example, since the memory device 150 includes the four planes 210, 230, 250 and 270, the code generation block 202 may generate four control codes OP_CODE<1:4>.

According to an embodiment, the code generation block 202 may read the source codes stored in the code storage block 201 in a period in which the first selection value SEL<1> is activated, and generate the first control code OP_CODE<1> corresponding to the first plane 210. According to an embodiment, the code generation block 202 may read the source codes stored in the code storage block 201 in a period in which the second selection value SEL<2> is activated, and generate the second control code OP_CODE<2> corresponding to the second plane 230. According to an embodiment, the code generation block 202 may read the source codes stored in the code storage block 201 in a period in which the third selection value SEL<3> is activated, and generate the third control code OP_CODE<3> corresponding to the third plane 250. According to an embodiment, the code generation block 202 may read the source codes stored in the code storage block 201 in a period in which the fourth selection value SEL<4> is activated, and generate the fourth control code OP_CODE<4> corresponding to the fourth plane 270.

More specifically, the source code corresponding to one operation among the source codes stored in the code storage block 201 may be divided into at least two sequential codes.

According to an embodiment, the source code for controlling the performance of the read operation among the source codes stored in the code storage block 201 may be divided into 400 sequential codes.

According to an embodiment, the source code for controlling the performance of the program operation among the source codes stored in the code storage block 201 may be divided into 500 sequential codes.

When a source code corresponding to one operation among the source codes stored in the code storage block 201 is read, the code generation block 202 may sequentially read at least two sequential codes one by one, and generate each of the plurality of control codes OP_CODE<1:4> by at least two or more.

According to an embodiment, when the code generation block 202 reads the source codes stored in the code storage block 201 according to the input command IN_CMD and input address IN_ADD corresponding to the read operation on the first plane 210, the code generation block 202 may sequentially read the 400 sequential codes, which are stored in the code storage block 201 and correspond to the read operation, one by one for each activation period of the first selection value SEL<1> that is repeated 400 times, and sequentially generate 400 pieces of the first control code OP_CODE<1>.

According to an embodiment, when the code generation block 202 reads the source codes stored in the code storage block 201 according to the input command IN_CMD and input address IN_ADD corresponding to the program operation on the second plane 230, the code generation block 202 may sequentially read the 500 sequential codes, which are stored in the code storage block 201 and correspond to the program operation, one by one for each activation period of the second selection value SEL<2> that is repeated 500 times, and sequentially generate 500 pieces of the second control code OP_CODE<2>.

According to an embodiment, when the code generation block 202 reads the source codes stored in the code storage block 201 according to the input command IN_CMD and input address IN_ADD corresponding to the erase operation on the third plane 250, the code generation block 202 may sequentially read 300 sequential codes, which are stored in the code storage block 201 and correspond to the erase operation, one by one for each activation period of the third selection value SEL<3> that is repeated 300 times, and sequentially generate 300 pieces of the third control code OP_CODE<3>.

According to an embodiment, when the code generation block 202 reads the source codes stored in the code storage block 201 according to the input command IN_CMD and input address IN_ADD corresponding to the read operation on the fourth plane 270, the code generation block 202 may sequentially read the 400 sequential codes, which are stored in the code storage block 201 and correspond to the read operation, one by one for each activation period of the fourth selection value SEL<4> that is repeated 400 times, and sequentially generate 400 pieces of the third control code OP_CODE<3>. In this case, since the operation of the code generation block 202 reading the source codes stored in the code storage block 201 for the read operation on the first plane 210 and the operation of the code generation block 202 reading the source codes stored in the code storage block 201 for the read operation on the fourth plane 270 are operations of reading the source codes stored in the code storage block 201 independently at different timings, the two operations may not have any influence on each other.

The code generation block 202 may internally store K input commands IN_CMD and input addresses IN_ADD. That is, the code generation block 202 may include an internal storage space for storing the K input commands IN_CMD and input addresses IN_ADD. Herein, "K" may be a multiple of "N", which represents the number of planes included in the memory device 150. For example, since the memory device 150 includes the four planes 210, 230, 250 and 270, assuming that a minimum of 0 and a maximum of 2 input commands IN_CMD and input addresses IN_ADD for each of the four planes 210, 230, 250 and 270 are stored in the code generation block 202, a minimum of 0 and a maximum of 8 input commands IN_CMD and input addresses IN_ADD may be stored in the code generation block 202. For reference, the fact that 0 input command IN_CMD and input address IN_ADD are stored in the code generation block 202 may mean a state where the code generation block 202 does not generate the control codes OP_CODE<1:4>. In addition, when there are two or more input commands IN_CMD and input addresses IN_ADD corresponding to the same plane among the K input commands IN_CMD and input addresses IN_ADD stored in the internal storage space, the code generation block 202 may process the two or more input commands IN_CMD and input addresses IN_ADD, which correspond to the same plane, in a first-in first-out (FIFO) method.

According to an embodiment, the code generation block 202 may sequentially read at least two sequential codes stored in the code storage block 201 one by one according to the input command IN_CMD and input address IN_ADD corresponding to the first plane 210 stored therein in the activation period of the first selection value SEL<1> that are repeated at least two times, and generate at least two pieces of the first control code OP_CODE<1>. For example, when the input command IN_CMD and input address IN_ADD for performing the read operation on the first plane 210 are stored in the code generation block 202, the code generation block 202 may sequentially read the 400 sequential codes for controlling the performance of the read operation, which are stored in the code storage block 201, one by one in the activation period of the first selection value SEL<1> that is repeated 400 times, and generate 400 pieces of the first control code OP_CODE<1>.

According to an embodiment, the code generation block 202 may sequentially read at least two sequential codes stored in the code storage block 201 one by one according to the input command IN_CMD and input address IN_ADD corresponding to the second plane 230 stored therein in the activation period of the second selection value SEL<2> that is repeated at least two times, and generate at least two pieces of the second control code OP_CODE<2>. For example, when the input command IN_CMD and input address IN_ADD for performing the program operation on the second plane 230 are stored in the code generation block 202, the code generation block 202 may sequentially read the 500 sequential codes for controlling the performance of the program operation, which are stored in the code storage block 201, one by one in the activation period of the second selection value SEL<2> that is repeated 500 times, and generate 500 pieces of the second control code OP_CODE<2>.

The signal generation block 204 may select a control code, which corresponds to the selection signals SEL<1:4>, from the plurality of control codes OP_CODE<1:4> corresponding to the plurality of planes 210, 230, 250 and 270, decode the selected control code, and generate an operation control signal OP_CON. In this case, the signal generation block 204 may decode one control code at a time, and generate the operation control signal OP_CON. That is, an operation period of the signal generation block 204 may be time-divided by the selection signals SEL<1:4>. For example, the signal generation block 204 may select each of the four control codes OP_CODE<1:4> one by one in the order determined according to the selection signals SEL<1:4>, decode the selected control codes, and generate the operation control signal OP_CON, as a decoding result, four times one by one in the order determined according to the selection signals SEL<1:4>.

More specifically, the signal generation block 204 may select a control code, which corresponds to the plurality of selection values SEL<1>, SEL<2>, SEL<3> and SEL<4>, from the plurality of control codes OP_CODE<1:4> corresponding to the plurality of planes 210, 230, 250 and 270, decode the selected control code, and generate the operation control signal OP_CON. In this case, the signal generation block 204 may decode one control code at a time, and generate the operation control signal OP_CON. In this case, the operation period of the signal generation block 204 may be time-divided by the fact that only one of the plurality of selection values SEL<1>, SEL<2>, SEL<3> and SEL<4> is activated and the other selection values are deactivated.

According to an embodiment, the signal generation block 204 may decode the first control code OP_CODE<1>, which corresponds to the first plane 210, in the activation period of the first selection value SEL<1>, and generate the operation control signal OP_CON corresponding to the first plane 210. According to an embodiment, the signal generation block 204 may decode each of 400 pieces of the first control code OP_CODE<1> that are sequentially inputted as the first selection value SEL<1> is repeatedly activated 400 times for the read operation on the first plane 210, and generate 400 pieces of the operation control signal OP_CON corresponding to the first plane 210.

According to an embodiment, the signal generation block 204 may decode the second control code OP_CODE<2>, which corresponds to the second plane 230, in the activation period of the second selection value SEL<2>, and generate the operation control signal OP_CON corresponding to the second plane 230. According to an embodiment, the signal generation block 204 may decode each of 500 pieces of the second control code OP_CODE<2> that are sequentially inputted as the second selection value SEL<2> is repeatedly activated 500 times for the program operation on the second plane 230, and generate 500 pieces of the operation control signal OP_CON corresponding to the second plane 230.

In this case, since operation periods of the 400 pieces of the operation control signal OP_CON corresponding to the first plane 210 and the 500 pieces of the operation control signal OP_CON corresponding to the second plane 230 are time-divided by the first selection value SEL<1> and the second selection value SEL<2>, respectively, the operation periods may not overlap.

The signal transmission block 206 may transmit the operation control signal OP_CON generated by the signal generation block 204 to one of the plurality of operation performing blocks 220, 240, 260 and 280 in response to the selection signals SEL<1:4>. That is, the signal transmission block 206 may generate an operation execution signal OP_EXECUTE in response to the operation control signal OP_CON received from the signal generation block 204, and then transmit the generated operation execution signal OP_EXECUTE to an operation performing block, which corresponds to the values of the selection signals SEL<1:4>, among the plurality of operation performing blocks 220, 240, 260 and 280.

More specifically, the signal transmission block 206 may transmit the operation control signal OP_CON generated by the signal generation block 204 to one of the plurality of operation performing blocks 220, 240, 260 and 280 in response to the plurality of selection values SEL<1>, SEL<2>, SEL<3> and SEL<4>. That is, the signal transmission block 206 may generate the operation execution signal OP_EXECUTE in response to the operation control signal OP_CON received from the signal generation block 204, and then transmit the generated operation execution signal OP_EXECUTE to one of the plurality of operation performing blocks 220, 240, 260 and 280 in response to an activated selection value of the plurality of selection values SEL<1>, SEL<2>, SEL<3> and SEL<4>.

According to an embodiment, the signal transmission block 206 may generate the operation execution signal OP_EXECUTE in response to the operation control signal OP_CON received from the signal generation block 204, in the activation period of the first selection value SEL<1>, and then transmit the generated operation execution signal OP_EXECUTE to the first operation performing block 220 corresponding to the first plane 210. For example, the signal transmission block 206 may sequentially generate 400 pieces of the operation execution signal OP_EXECUTE in response to 400 pieces of the operation control signal OP_CON, which are sequentially received from the signal generation block 204 and correspond to the first plane 210, for the read operation on the first plane 210, and then transmit the 400 pieces of the operation execution signal OP_EXECUTE to the first operation performing block 220.

According to an embodiment, the signal transmission block 206 may generate the operation execution signal OP_EXECUTE in response to the operation control signal OP_CON received from the signal generation block 204, in the activation period of the second selection value SEL<2>, and then transmit the generated operation execution signal OP_EXECUTE to the second operation performing block 240 corresponding to the second plane 230. For example, the signal transmission block 206 may sequentially generate 500 pieces of the operation execution signal OP_EXECUTE in response to 500 pieces of the operation control signal OP_CON, which are sequentially received from the signal generation block 204 and correspond to the second plane 230, for the program operation on the second plane 230, and then transmit the 500 pieces of the operation execution signal OP_EXECUTE to the second operation performing block 240.

The plurality of operation performing blocks 220, 240, 260 and 280 may perform operations, which are defined in advance according to a value of the operation control signal OP_CON generated by the signal generation block 204, on the plurality of planes 210, 230, 250 and 270, respectively. That is, the plurality of operation performing blocks 220, 240, 260 and 280 may receive the operation execution signal OP_EXECUTE generated by the signal transmission block 206 in order to perform the operations defined in advance according to the value of the operation control signal OP_CON, and perform operations defined by the received operation execution signal OP_EXECUTE on the plurality of planes 210, 230, 250 and 270, respectively. For example, the read operation performed on each of the plurality of planes 210, 230, 250 and 270 may be divided into 400 sequential and partial operations including a voltage pumping enable operation, a row decoding operation and a bit line level setting operation. Accordingly, each of the plurality of operation performing blocks 220, 240, 260 and 280 may sequentially perform the 400 partial operations in response to the 400 pieces of the operation execution signal OP_EXECUTE sequentially inputted through the signal transmission block 206 for the read operation.

For another example, the program operation performed on each of the plurality of planes 210, 230, 250 and 270 may be divided into 500 sequential and partial operations. Accordingly, each of the plurality of operation performing blocks 220, 240, 260 and 280 may sequentially perform the 500 partial operations in response to the 500 pieces of the operation execution signal OP_EXECUTE sequentially inputted through the signal transmission block 206 for the program operation.

More specifically, the signal transmission block 206 may transmit the operation control signal OP_CON generated by the signal generation block 204 to one of the plurality of operation performing blocks 220, 240, 260 and 280 through a path corresponding to the selection signals SEL<1:4> among the plurality of paths PATH<1:4> connecting the signal generation block 204 to the plurality of operation performing blocks 220, 240, 260 and 280. That is, the signal transmission block 206 may generate the operation execution signal OP_EXECUTE according to the value of the operation control signal OP_CON generated by the signal generation block 204, and then transmit the generated operation execution signal OP_EXECUTE to one of the plurality of operation performing blocks 220, 240, 260 and 280 through a path corresponding to the selection signals SEL<1:4> among the plurality of paths PATH<1:4>.

According to an embodiment, the signal generation block 204 may generate the operation control signal OP_CON corresponding to the first plane 210, and transmit the operation control signal OP_CON to the signal transmission block 206. The signal transmission block 206 may generate the operation execution signal OP_EXECUTE in response to the operation control signal OP_CON received from the signal generation block 204, and transmit the generated operation execution signal OP_EXECUTE to the first operation performing block 220 corresponding to the first plane 210 through the first path PATH<1> corresponding to the selection signals SEL<1:4>. The first operation performing block 220 may perform an operation defined by the operation execution signal OP_EXECUTE transmitted through the first path PATH<1>, for example, one of the 400 partial operations included in the read operation, on the first plane 210.

According to an embodiment, the signal generation block 204 may generate the operation control signal OP_CON corresponding to the second plane 230, and transmit the operation control signal OP_CON to the signal transmission block 206. The signal transmission block 206 may generate the operation execution signal OP_EXECUTE in response to the operation control signal OP_CON received from the signal generation block 204, and transmit the generated operation execution signal OP_EXECUTE to the second operation performing block 240 corresponding to the second plane 230 through the second path PATH<2> corresponding to the selection signals SEL<1:4>. The second operation performing block 240 may perform an operation defined by the operation execution signal OP_EXECUTE transmitted through the second path PATH<2>, for example, any of the 500 partial operations included in the program operation, on the second plane 230.

Figure 2:
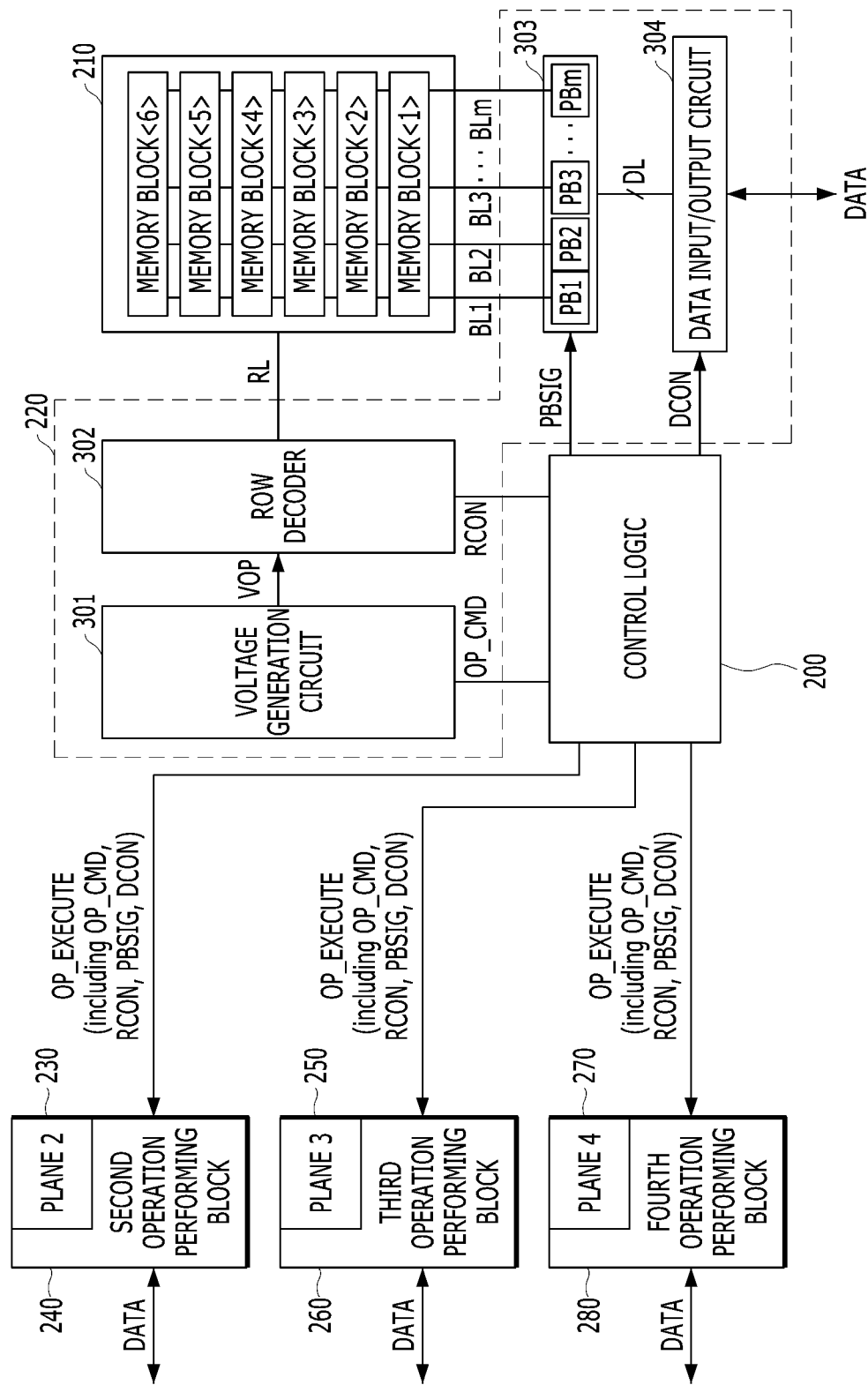
FIG. 2 is a diagram illustrating an example of planes and operation performing blocks included in the memory device illustrated in FIG. 1 in accordance with an embodiment of the present disclosure.

FIG. 2 is a diagram illustrating an example of the planes 210, 230, 250 and 270 and the operation performing blocks 220, 240, 260 and 280 included in the memory device 150 illustrated in FIG. 1 in accordance with an embodiment of the present disclosure.

FIG. 2 illustrates detailed configurations of the first plane 210 among the plurality of planes 210, 230, 250 and 270 and the first operation performing block 220 among the plurality of operation performing blocks 220, 240, 260 and 280 that are included in the memory device 150 in accordance with the present embodiment.

Specifically, the first plane 210 among the plurality of planes 210, 230, 250 and 270 may include a plurality of memory blocks MEMORY BLOCK<1:6>. Although not illustrated in FIG. 2, like the first plane 210, each of the other planes 230, 250 and 270 may also include a plurality of memory blocks. For reference, although FIG. 2 illustrates that six memory blocks MEMORY BLOCK<1:6> are included in one plane, this is merely an embodiment, and in actuality, more or fewer memory blocks may be included in one plane.

The first operation performing block 220 among the plurality of operation performing blocks 220, 240, 260 and 280 may include a voltage generation circuit 301, a row decoder 302, a page buffer group 303 and a data input/output circuit 304. Although not illustrated in FIG. 2, like the first operation performing block 220, each of the other operation performing blocks 240, 260 and 280 may also include various components such as the voltage generation circuit 301, the row decoder 302, the page buffer group 303 and the data input/output circuit 304 therein. For reference, although FIG. 2 illustrates that four components are included in one operation performing block, for example, the voltage generation circuit 301, the row decoder 302, the page buffer group 303 and the data input/output circuit 304 are included in the first operation performing block 220, this is merely an embodiment, and in actuality, other components may be further included in one operation performing block or some of the components already included in one operation performing block may be replaced, depending on types of various operations that may be performed by the operation performing block.

Specifically, the control logic 200 may be connected to the first operation performing block 220 through the first path PATH<1> as illustrated in FIG. 1. That is, as illustrated in FIG. 2, four solid arrow lines connected between the control logic 200 and the first operation performing block 220 may represent the first path PATH<1> illustrated in FIG. 1. Similarly, although not illustrated in FIG. 2, the control logic 200 may be connected to various components included in the second operation performing block 240 through the second path PATH<2>, be connected to various components included in the third operation performing block 260 through the third path PATH<3>, and be connected to various components included in the fourth operation performing block 280 through the fourth path PATH<4>. Although configurations and operations are described below based on the components 301, 302, 303 and 304 included in the first operation performing block 220, this is merely for convenience in description, and each of the plurality of operation performing blocks 240, 260 and 280 may have the same configurations as the first operation performing block 220 and operate in a similar manner to the first operation performing block 220.

The control logic 200 may generate the operation execution signal OP_EXECUTE, and control the components 301, 302, 303 and 304 included in the first operation performing block 220. In this case, the operation execution signal OP_EXECUTE may include a signal OP_CMD for controlling an operation of the voltage generation circuit 301, a signal RCON for controlling an operation of the row decoder 302, a signal PBSIG for controlling an operation of the page buffer group 303 and a signal DCON for controlling an operation of the data input/output circuit 304.

The plurality of memory blocks MEMORY BLOCK<1:6> included in the first plane 210 may be connected to the row decoder 302 through a row line RL. In addition, the plurality of memory blocks MEMORY BLOCK<1:6> included in the first plane 210 may be connected to the page buffer group 303 through bit lines BL1 to BLm.

The row line RL may include at least one source selection line, a plurality of word lines and at least one drain selection line.

The row decoder 302 may select at least one memory block from the plurality of memory blocks MEMORY BLOCK<1:6> in response to the signal RCON received from the control logic 200. The row decoder 302 may be configured to decode a row address included in the received signal RCON. The row decoder 302 may select at least one word line from word lines of the selected memory block according to the decoded row address. The row decoder 302 may apply operating voltages VOP, which are supplied from the voltage generation circuit 301, to the selected word line.

During the program operation, the row decoder 302 may apply a program voltage to the selected word line, and apply a pass voltage having a lower level than the program voltage to a non-selected word line. During a program verification operation, the row decoder 302 may apply a read voltage for verification to the selected word line, and apply a verification pass voltage having a higher level than the read voltage for verification to the non-selected word line.

During the read operation, the row decoder 302 may apply a read voltage to the selected word line, and apply a read pass voltage having a higher level than the read voltage to the non-selected word line.

The erase operation may be performed in units of memory blocks. The signal RCON inputted to the row decoder 302 may include a block address. The row decoder 302 may decode the block address, and select at least one memory block according to the decoded block address. During the erase operation, the row decoder 302 may apply an erase voltage to the selected memory block.

The voltage generation circuit 301 may be configured to generate the plurality of operating voltages VOP having various voltage levels, by using an external power supply voltage. The voltage generation circuit 301 may operate in response to the signal OP_CMD applied by the control logic 200.

The voltage generation circuit 301 may include a plurality of pumping capacitors, which receive the internal power supply voltage, in order to generate the plurality of operating voltages VOP having various voltage levels, selectively activate the plurality of pumping capacitors in response to the control of the control logic 200, and generate the plurality of operating voltages VOP.

The generated operating voltages VOP may be supplied to the first plane 210 by the row decoder 302.

The page buffer group 303 may include a plurality of page buffers PB1 to PBm. The plurality of page buffers PB1 to PBm may be connected to the plurality of memory blocks MEMORY BLOCK<1:6> included in the first plane 210, through the plurality of bit lines BL1 to BLm, respectively. The plurality of page buffers PB1 to PBm may operate in response to the signal PBSIG applied by the control logic 200.

The plurality of page buffers PB1 to PBm may exchange data DATA with the data input/output circuit 304. During the program operation, the plurality of page buffers PB1 to PBm may receive the data DATA to be stored therein, through the data input/output circuit 304 and a data line DL.

During the program operation, when the program voltage is applied to the selected word line, the plurality of page buffers PB1 to PBm may transmit the data DATA, which is to be stored, received through the data input/output circuit 304 to a selected memory cell through the bit lines BL1 to BLm. The memory cell of a selected page may be programmed according to the transmitted data DATA. A memory cell connected to a bit line through which a program allowable voltage, for example, a ground voltage, is applied may have a raised threshold voltage. A threshold voltage of a memory cell connected to a bit line through which a program prohibition voltage, for example, a power supply voltage, is applied may be maintained. During the program verification operation, the plurality of page buffers PB1 to PBm may read the data DATA stored in the memory cell through the bit lines BL1 to BLm from the selected memory cell.

During the read operation, the page buffer group 303 may read the data DATA from the memory cell of the selected page through the bit lines BL, and store the read data DATA in the plurality of page buffers PB1 to PBm.

During the erase operation, the page buffer group 303 may allow the bit lines BL to float. In an embodiment, the page buffer group 303 may include a column selection circuit.

The data input/output circuit 304 may be connected to the plurality of page buffers PB1 to PBm through the data line DL. The data input/output circuit 304 may operate in response to the signal DCON applied by the control logic 200.

The data input/output circuit 304 may include a plurality of input/output buffers (not illustrated) for receiving the inputted data DATA. During the program operation, the data input/output circuit 304 may receive the data DATA to be stored therein from the outside. During the read operation, the data input/output circuit 304 may output the data DATA, transmitted from the plurality of page buffers PB1 to PBm included in the page buffer group 303, to the outside.

Figure 3:
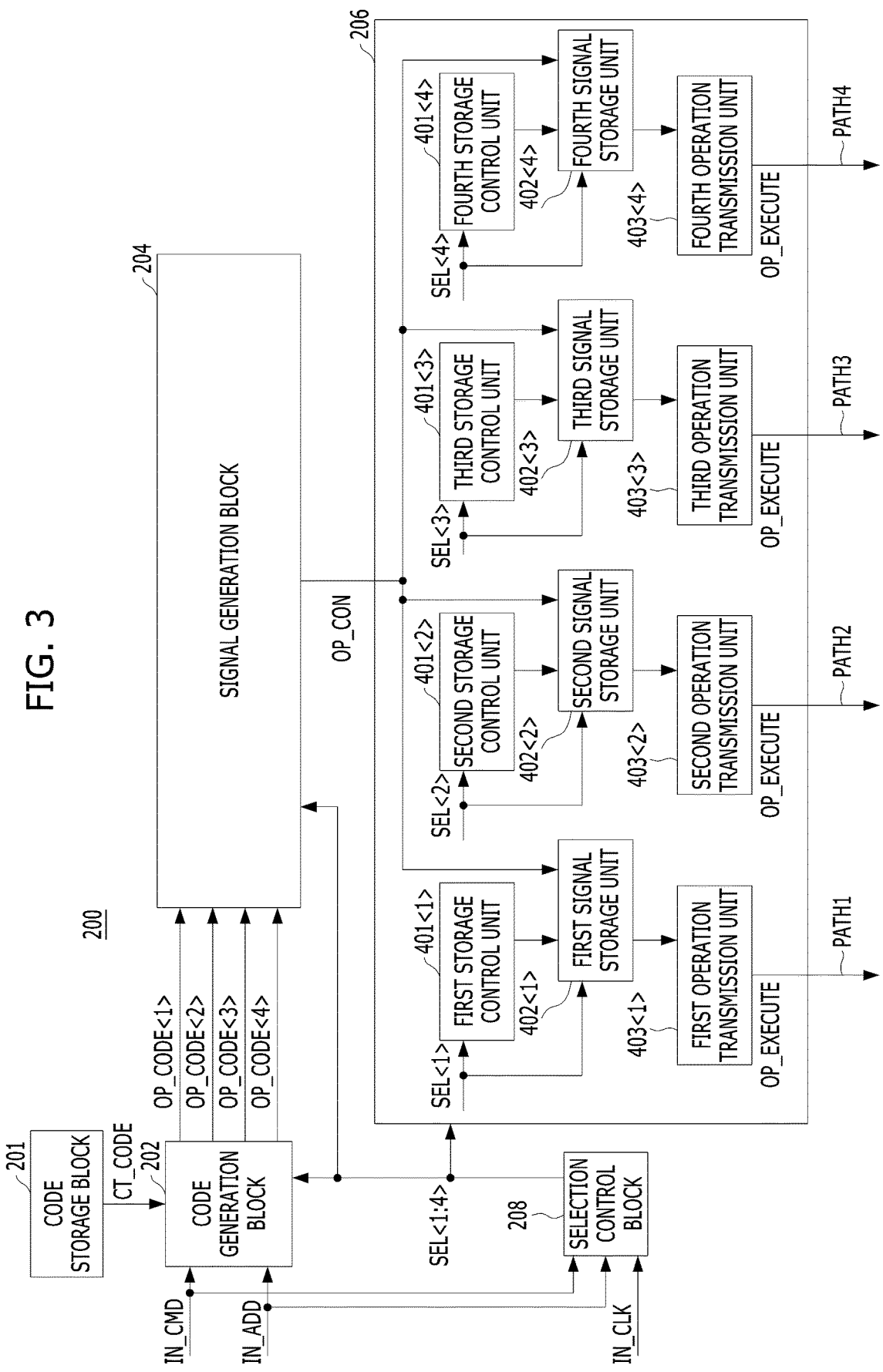
FIG. 3 is a diagram illustrating detailed configurations of the control logic included in the memory device illustrated in FIG. 1 in accordance with an embodiment of the present disclosure.

FIG. 3 is a diagram illustrating detailed configurations of the control logic 200 included in the memory device 150 illustrated in FIG. 1 in accordance with an embodiment of the present disclosure.

Referring to FIG. 3, the control logic 200 included in the memory device 150 in accordance with the present embodiment may include the code generation block 202, the signal generation block 204, the signal transmission block 206 and the selection control block 208. The signal transmission block 206 may include a plurality of storage control units 401<1:4>, a plurality of signal storage units 402<1:4> and a plurality of operation transmission units 403<1:4>.

Among the components illustrated in FIG. 3, specific configurations and operations of the code storage block 201, the code generation block 202, the selection control block 208 and the signal generation block 204 have been described above with reference to FIG. 1. Accordingly, configurations and operations of the components 401<1:4>, 402<1:4> and 403<1:4> included in the signal transmission block 206 are described in detail below.

The signal transmission block 206 may transmit the operation control signal OP_CON generated by the signal generation block 204 to one of the plurality of operation performing blocks 220, 240, 260 and 280 in response to the plurality of selection values SEL<1>, SEL<2>, SEL<3> and SEL<4>. That is, the signal transmission block 206 may generate the operation execution signal OP_EXECUTE in response to the operation control signal OP_CON received from the signal generation block 204, and then transmit the generated operation execution signal OP_EXECUTE to one of the plurality of operation performing blocks 220, 240, 260 and 280 in response to an activated selection value of the plurality of selection values SEL<1>, SEL<2>, SEL<3> and SEL<4>.

Specifically, the plurality of signal storage units 402<1:4> included in the signal transmission block 206 may store the operation control signal OP_CON generated by the signal generation block 204, according to the control of the plurality of storage control units 401<1:4>, respectively. In addition, the plurality of signal storage units 402<1:4> may output the value of the operation control signal OP_CON stored therein, in response to the plurality of selection values SEL<1>, SEL<2>, SEL<3> and SEL<4>, respectively. The plurality of storage control units 401<1:4> included in the signal transmission block 206 may store the operation control signal OP_CON generated by the signal generation block 204 in the plurality of signal storage units 402<1:4> during the activation periods of the plurality of selection values SEL<1>, SEL<2>, SEL<3> and SEL<4>, respectively.

The plurality of operation transmission units 403<1:4> included in the signal transmission block 206 may generate the operation execution signal OP_EXECUTE according to the value of the operation control signal OP_CON outputted by the plurality of signal storage units 402<1:4>, respectively, and output the operation execution signal OP_EXECUTE to the plurality of operation performing blocks 220, 240, 260 and 280 through the plurality of paths PATH<1:4>, respectively.

More specifically, the plurality of signal storage units 402<1:4> may output the operation control signal OP_CON stored therein to the plurality of operation transmission units 403<1:4>, respectively, during a predetermined period based on toggling of an input clock IN_CLK from points in time at which the respective selection values SEL<1>, SEL<2>, SEL<3> and SEL<4> are deactivated. That is, the plurality of signal storage units 402<1:4> may transmit the operation control signal OP_CON stored therein to the plurality of operation transmission units 403<1:4>, respectively, during the predetermined period from the points in time at which the respective selection values SEL<1>, SEL<2>, SEL<3> and SEL<4> are deactivated after the activation periods of the selection values SEL<1>, SEL<2>, SEL<3> and SEL<4> terminates. In this case, the predetermined period may refer to a period in which the number of times that the input clock IN_CLK toggles is repeated by a predetermined number of times.

According to the number of planes 210, 230, 250 and 270 included in the memory device 150, the number of the plurality of storage control units 401<1:4>, the number of the plurality of signal storage units 402<1:4> and the number of the plurality of operation transmission units 403<1:4> may be determined. For example, as illustrated in FIG. 1, when the four planes 210, 230, 250 and 270 are included in the memory device 150, four storage control units 401<1:4>, four signal storage units 402<1:4> and four operation transmission units 403<1:4> may be included in the signal transmission block 206, as illustrated in FIG. 2.

According to an embodiment, the operation control signal OP_CON corresponding to the first plane 210 may be generated by the signal generation block 204 during a period in which the first selection value SEL<1> corresponding to the first plane 210 is activated. In this case, the operation control signal OP_CON generated by the signal generation block 204 may be stored in the first signal storage unit 402<1> through the operation of the first storage control unit 401<1> enabled during the period in which the first selection value SEL<1> is activated, among the plurality of storage control units 401<1:4>. Since the other selection values SEL<2>, SEL<3> and SEL<4> are deactivated during the period in which the first selection value SEL<1> corresponding to the first plane 210 is activated, the operation control signal OP_CON generated by the signal generation block 204 may not be stored in the other signal storage units 402<2:4> except for the first signal storage unit 402<1>.

More specifically, a period between the first rising edge and the second rising edge of the input clock IN_CLK is the activation period of the first selection value SEL<1> corresponding to the first plane 210. In addition, the period in which the number of times that the input clock IN_CLK toggles is repeated four times is a predetermined period. That is, a period between the second rising edge and the sixth rising edge of the input clock IN_CLK is a predetermined period corresponding to the first selection value SEL<1>.

In this case, the first storage control unit 401<1> corresponding to the first plane 210 among the plurality of storage control units 401<1:4> may store the operation control signal OP_CON generated by the signal generation block 204 in the first signal storage unit 402<1> from the first rising edge of the input clock IN_CLK to the second rising edge of the input clock IN_CLK.

The first signal storage unit 402<1> corresponding to the first plane 210 among the plurality of signal storage units 402<1:4> may output the operation control signal OP_CON stored therein to the first operation transmission unit 403<1> corresponding to the first plane 210 among the plurality of operation transmission units 403<1:4> during the predetermined period between the second rising edge and the sixth rising edge of the input clock IN_CLK. Therefore, the first operation transmission unit 403<1> corresponding to the first plane 210 may generate the operation execution signal OP_EXECUTE according to the value of the operation control signal OP_CON outputted by the first signal storage unit 402<1>, and output the operation execution signal OP_EXECUTE to the first operation performing block 220 through the first path PATH<1>, during the predetermined period between the second rising edge and the sixth rising edge of the input clock IN_CLK.

According to an embodiment, the operation control signal OP_CON corresponding to the second plane 230 may be generated by the signal generation block 204 during a period in which the second selection value SEL<2> corresponding to the second plane 230 is activated. In this case, the operation control signal OP_CON generated by the signal generation block 204 may be stored in the second signal storage unit 402<2> through the operation of the second storage control unit 401<2> enabled during the period in which the second selection value SEL<2> is activated, among the plurality of storage control units 401<1:4>. Since the other selection values SEL<1>, SEL<3> and SEL<4> are deactivated during the period in which the second selection value SEL<2> corresponding to the second plane 230 is activated, the operation control signal OP_CON generated by the signal generation block 204 may not be stored in the other signal storage units 402<1,3,4> except for the second signal storage unit 402<2>.

More specifically, a period between the second rising edge and the third rising edge of the input clock IN_CLK is the activation period of the second selection value SEL<2> corresponding to the second plane 230. In addition, the period in which the number of times that the input clock IN_CLK toggles is repeated four times is a predetermined period. That is, a period between the third rising edge and a seventh rising edge of the input clock IN_CLK is a predetermined period corresponding to the second selection value SEL<2>.

In this case, the second storage control unit 401<2> corresponding to the second plane 230 among the plurality of storage control units 401<1:4> may store the operation control signal OP_CON generated by the signal generation block 204 in the second signal storage unit 402<2> from the second rising edge of the input clock IN_CLK to the third rising edge of the input clock IN_CLK.

The second signal storage unit 402<2> corresponding to the second plane 230 among the plurality of signal storage units 402<1:4> may output the operation control signal OP_CON stored therein to the second operation transmission unit 403<2> corresponding to the second plane 230 among the plurality of operation transmission units 403<1:4> during the predetermined period between the third rising edge and the seventh rising edge of the input clock IN_CLK. Therefore, the second operation transmission unit 403<2> corresponding to the second plane 230 may generate the operation execution signal OP_EXECUTE according to the value of the operation control signal OP_CON outputted by the second signal storage unit 402<2>, and output the operation execution signal OP_EXECUTE to the second operation performing block 240 through the second path PATH<2>, during the predetermined period between the third rising edge and the seventh rising edge of the input clock IN_CLK.

Figure 4:
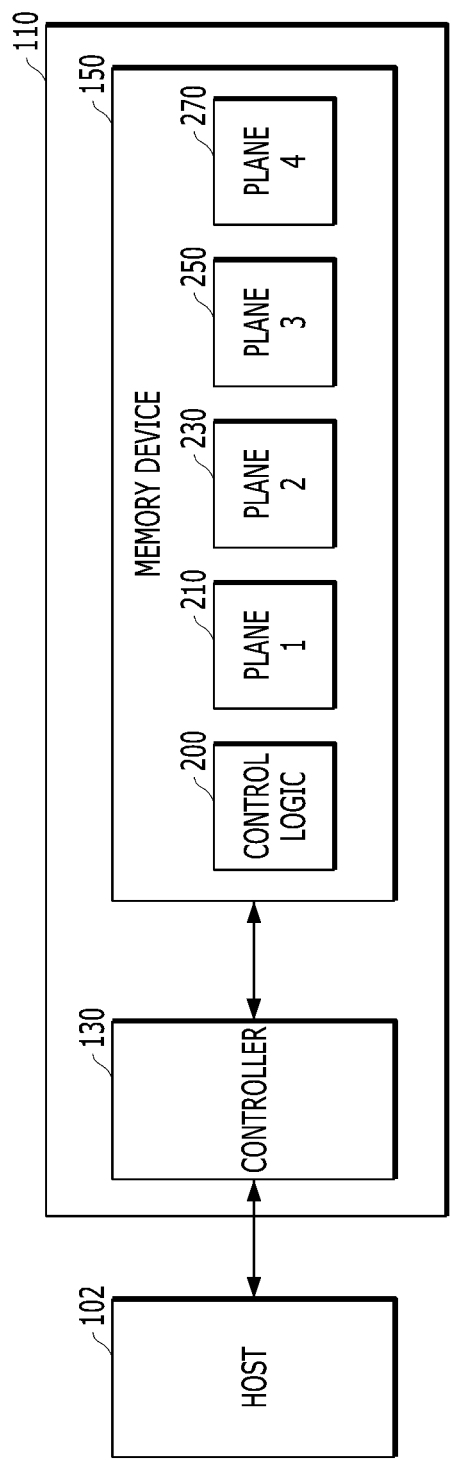
FIG. 4 is a diagram illustrating an example of a memory system including the memory device illustrated in FIGS. 1 to 3 in accordance with an embodiment of the present disclosure.

FIG. 4 is a diagram illustrating an example of a memory system 110 including the memory device 150 illustrated in FIGS. 1 to 3 in accordance with an embodiment of the present disclosure.

As may be seen from the fact that the reference numeral of the memory device 150 illustrated in FIG. 4 and the reference numeral of the memory device 150 illustrated in FIG. 1 are both "150", the memory device 150 illustrated in FIG. 4 may refer to the memory device 150 in accordance with the present embodiment illustrated in FIGS. 1 to 3 above. That is, referring to FIG. 4, it may be seen in what form the memory device 150 in accordance with the present embodiment may be applied to the memory system 110.

Referring to FIG. 4, the data processing system 100 may include a host 102 engaged or coupled with a memory system, such as memory system 110. For example, the host 102 and the memory system 110 can be coupled to each other via a data bus, a host cable and the like to perform data communication.

The memory system 110 may include a memory device 150 and a controller 130. The memory device 150 and the controller 130 in the memory system 110 may be considered components or elements physically separated from each other. The memory device 150 and the controller 130 may be connected via at least one data path. For example, the data path may include a channel and/or a way.

According to an embodiment, the memory device 150 and the controller 130 may be components or elements functionally divided. Further, according to an embodiment, the memory device 150 and the controller 130 may be implemented with a single chip or a plurality of chips. The controller 130 may perform a data input/output operation in response to a request input from the external device. For example, when the controller 130 performs a read operation in response to a read request input from an external device, data stored in a plurality of non-volatile memory cells included in the memory device 150 is transferred to the controller 130.

The controller 130 may control the memory device 150 to perform read, program and erase operations corresponding to commands inputted from the host 102, and the memory system 110 may independently perform the operations regardless of commands inputted from an external device such as the host 102. With respect to the memory device 150, the controller 130 may also perform a garbage collection (GC) operation, a wear leveling (WL) operation and a bad block management operation of checking and processing bad blocks.

In an embodiment, the memory device 150 is embodied as a non-volatile memory such as a flash memory, for example, a NAND flash memory, a NOR flash memory, or the like. In another embodiment, the memory device 150 may be implemented by at least one of a phase change random access memory (PCRAM), a ferroelectrics random access memory (FRAM), a transfer torque random access memory (SU-RAM), and a spin transfer torque magnetic random access memory (STT-MRAM), or the like.

For example, the memory system 110 may be implemented with any of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like.

Specifically, as described with reference to FIGS. 1 and 2, the memory device 150 may include the plurality of planes 210, 230, 250 and 270 and the control logic 200. In addition, each of the plurality of planes 210, 230, 250 and 270 may include the plurality of memory blocks MEMORY BLOCK<1:6> each including the plurality of pages (not illustrated) each including the plurality of memory cells.

The memory blocks MEMORY BLOCK<1:6> may be understood as a group of non-volatile memory cells from which data are removed together through the erase operation. Each of the memory blocks MEMORY BLOCK<1:6> may include a page (not illustrated) in which the non-volatile memory cells are grouped, from a logical point of view, such as storing of data together during the program operation or outputting of data together during the read operation. For example, one memory block may include a plurality of pages. One page may include a plurality of non-volatile memory cells.

From a physical point of view different from the logical point of view such as the program operation or the read operation, one memory block may include a plurality of word lines (not illustrated). One word line may include a plurality of non-volatile memory cells.

In this case, one word line may correspond to at least one page according to the number of bits that can be stored or expressed in one non-volatile memory cell. For example, when one non-volatile memory cell is a single level cell (SLC) storing one data bit, one word line may correspond to one page. When one non-volatile memory cell is a double level cell (DLC) storing two data bits, one word line may correspond to two pages. When one non-volatile memory cell is a triple level cell (TLC) storing three data bits, one word line may correspond to three pages. When one non-volatile memory cell is a quadruple level cell (QLC) storing four data bits, one word line may correspond to four pages. In this way, when one non-volatile memory cell is a multiple level cell storing five or more data bits, one word line may correspond to five or more pages.

The control logic 200 may independently control an operation of each of the plurality of planes 210, 230, 250 and 270. That is, each of the plurality of planes 210, 230, 250 and 270 may independently perform the erase operation, the read operation or the program operation under the control of the control logic 200. For example, during a period in which the erase operation is performed on one plane, each of the plurality of planes 210, 230, 250 and 270 may perform the program operation on another plane.

Figure 5:
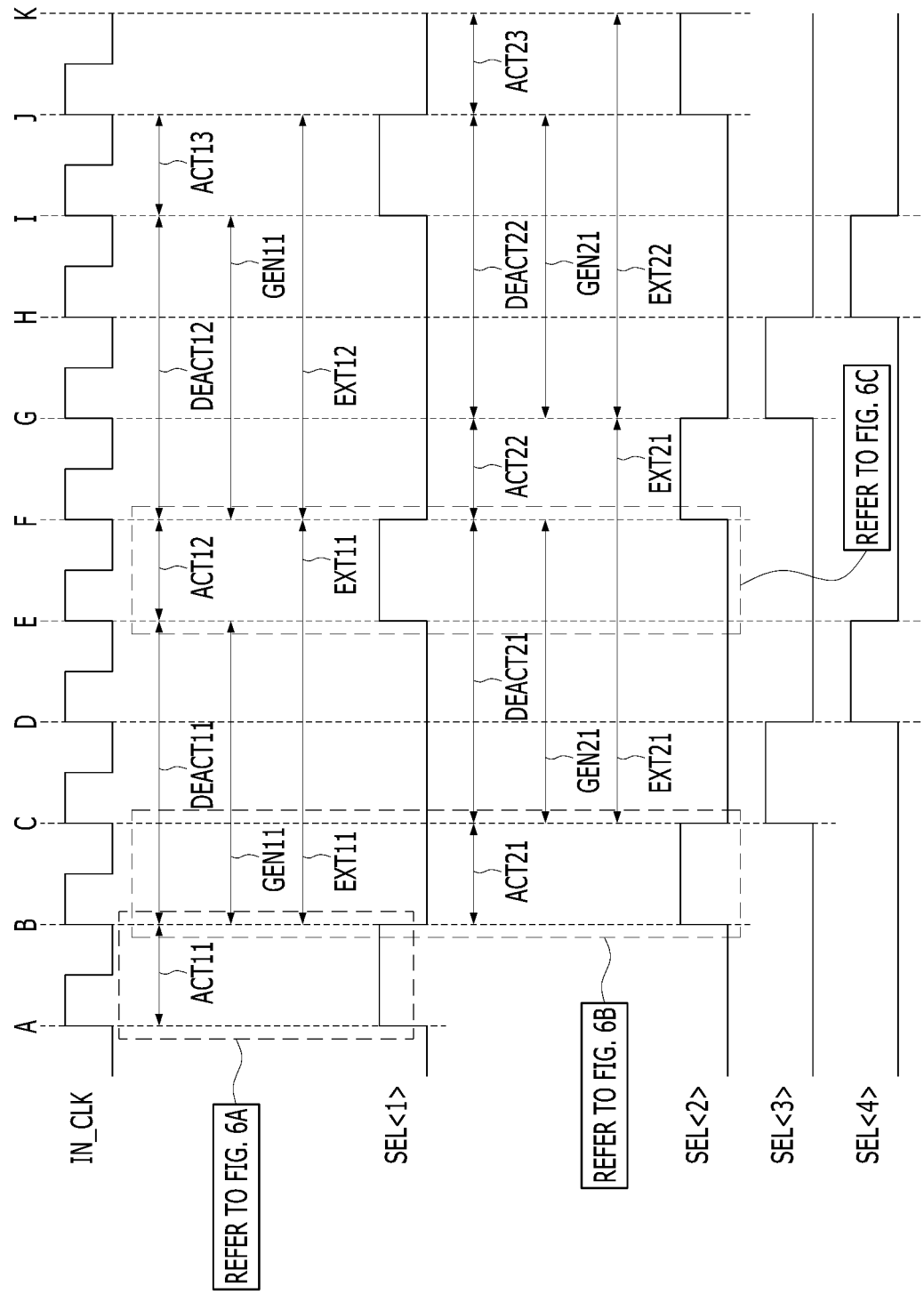
FIG. 5 is a diagram illustrating an operation of the control logic included in the memory device illustrated in FIGS. 1 to 3 in accordance with an embodiment of the present disclosure.

FIG. 5 is a diagram illustrating an operation of the control logic 200 included in the memory device 150 illustrated in FIGS. 1 to 3 in accordance with an embodiment of the present disclosure.

Referring to FIG. 5, the operation of the control logic 200 included in the memory device 150 in accordance with the present embodiment may be classified based on the toggling of the input clock IN_CLK.

Specifically, a period between a point in time A corresponding to a first rising edge of the input clock IN_CLK and a point in time B corresponding to a second rising edge of the input clock IN_CLK may be a period ACT11 in which only the first selection value SEL<1> corresponding to the first plane 210 may be activated to a logic "high" level and the other selection values SEL<2:4> are deactivated to a logic "low" level.

At the point in time B, the first selection value SEL<1> may be deactivated from the logic "high" level to the logic "low" level, and a period between the point in time B in which the first selection value SEL<1> is deactivated after being activated and a point in time E corresponding to a fifth rising edge of the input clock IN_CLK may be a period DEACT11 in which the first selection value SEL<1> maintains the logic "low" level in the deactivated state.

A period between the point in time E and a point in time F corresponding to a sixth rising edge of the input clock IN_CLK may be a period ACT12 in which the first selection value SEL<1> is activated again to the logic "high" level. That is, the first selection value SEL<1> may be activated during the period between the point in time A and the point in time B, be deactivated during the period between the point in time B and the point in time E, and be activated again during the period between the point in time E and the point in time F.

A period between the point in time B and the point in time F may be a period EXT11, which is a predetermined period corresponding to the first selection value SEL<1>. That is, the period EXT11 may be longer than the period DEACT11.

During each of the periods ACT11 and ACT12, the signal generation block 204 may decode the first control code OP_CODE<1> corresponding to the first plane 210, and generate the operation control signal OP_CON. During the period ACT11, the first storage control unit 401<1> may store the operation control signal OP_CON corresponding to the first plane 210, which is generated by the signal generation block 204, in the first signal storage unit 402<1>. In this case, the operation control signal OP_CON generated by the signal generation block 204 during the period ACT11 and the operation control signal OP_CON generated by the signal generation block 204 during the period ACT12 may have continuity therebetween in that each of the signals is a signal generated in correspondence with the same input command IN_CMD and input address IN_ADD. For example, the operation control signal OP_CON generated by the signal generation block 204 during the period ACT11 and the operation control signal OP_CON generated by the signal generation block 204 during the period ACT12 may have continuity therebetween in that each of the signals is a signal for changing values or states of the signals OP_CMD, RCON, PBSIG and DCON (refer to FIG. 2) generated by the first operation performing block 220 so that each of a previous partial operation and a subsequent partial operation according to the order among the 400 sequential and partial operations included in the read operation on the first plane 210 may be performed on the first plane 210.

During the period EXT11, the first storage control unit 401<1> may output the operation control signal OP_CON stored therein to the first operation transmission unit 403<1>. In addition, during the period EXT11, the first operation transmission unit 403<1> may generate the operation execution signal OP_EXECUTE according to the value of the operation control signal OP_CON outputted by the first storage control unit 401<1>, and transmit the operation execution signal OP_EXECUTE to the first operation performing block 220 through the first path PATH<1>. In this case, since the operation control signal OP_CON generated by the signal generation block 204 during the period ACT11 and the operation control signal OP_CON generated by the signal generation block 204 during the period ACT12 are signals having continuity, a part of the period EXT11 may overlap with the period ACT12.

In this case, the length of the period EXT11 may correspond to a time sufficient for the first operation performing block 220 to perform a predefined operation on the first plane 210. That is, even when a part of the period EXT11 does not overlap with the period ACT12, the length of the period EXT11 may be the length of the period between the point in time B and the point in time F as illustrated in FIG. 5.

The first selection value SEL<1> may be deactivated to the logic "low" level during a period DEACT12 between the point in time F and a point in time I corresponding to a ninth rising edge of the input clock IN_CLK, and be activated to the logic "high" level during a period ACT13 between the point in time I and a point in time J corresponding to a $10^{th}$ rising edge of the input clock IN_CLK. A period between the point in time F and the point in time J may be a period EXT12, which is a predetermined period corresponding to the first selection value SEL<1>.

The second selection value SEL<2> corresponding to the second plane 230 may be activated to the logic "high" level during a period ACT 21 between the point in time B and a point in time C corresponding to a third rising edge of the input clock IN_CLK, be deactivated to the logic "low" level during a period DEACT21 between the point in time C and the point in time F corresponding to the sixth rising edge of the input clock IN_CLK, and be activated to the logic "high" level during a period ACT22 between the point in time F and a point in time G corresponding to a seventh rising edge of the input clock IN_CLK. A period between the point in time C and the point in time G may be a period EXT21, which is a predetermined period corresponding to the second selection value SEL<2>.

It may be seen that a period between the point in time F and the point in time G is a period in which the period EXT21 and the period ACT22 overlap with each other. The reason why the period EXT21 and the period ACT22 may overlap with each other may be that the operation control signal OP_CON generated by the signal generation block 204 during the period ACT21 and the operation control signal OP_CON generated by the signal generation block 204 during the period ACT22 may have continuity therebetween in that each of the signals is a signal generated in correspondence with the same input command IN_CMD and input address IN_ADD.

In this case, the length of the period EXT21 may correspond to a time sufficient for the second operation performing block 240 to perform a predefined operation on the second plane 230. That is, even when a part of the period EXT21 does not overlap with the period ACT22, the length of the period EXT21 may be a period between the point in time C and the point in time G as illustrated in FIG. 5.

The second selection value SEL<2> corresponding to the second plane 230 may be deactivated to the logic "low" level during a period DEACT22 between the point in time G and the point in time 3, and be activated to the logic "high" level during a period ACT23 between the point in time I and a point in time K corresponding to an $11^{th}$ rising edge of the input clock IN_CLK. A period between the point in time G and the point in time K may be a period EXT22, which is a predetermined period corresponding to the second selection value SEL<2>.

The third selection value SEL<3> corresponding to the third plane 250 may be activated to the logic "high" level during a period between the point in time C and a point in time D corresponding to a fourth rising edge of the input clock IN_CLK, be deactivated to the logic "low" level during a period between the point in time D and the point in time G, be activated to the logic "high" level during a period between the point in time G and a point in time H corresponding to an eighth rising edge of the input clock IN_CLK, and be deactivated to the logic "low" level during a period between the point in time H and the point in time K. A period between the point in time D and the point in time H may be a predetermined period corresponding to the third selection value SEL<3>.

The fourth selection value SEL<4> corresponding to the fourth plane 270 may be activated to the logic "high" level during a period between the point in time D and the point in time E, be deactivated to the logic "low" level during a period between the point in time E and the point in time H, be activated to the logic "high" level during a period between the point in time H and the point in time I, and be deactivated to the logic "low" level from the point in time I. A period between the point in time E and the point in time I may be a predetermined period corresponding to the fourth selection value SEL<4>.

To sum up, each of the plurality of selection values SEL<1>, SEL<2>, SEL<3> and SEL<4> may be activated according to a predetermined order, in a form in which the activation periods thereof do not overlap with one another. In addition, each of the plurality of selection values SEL<1>, SEL<2>, SEL<3> and SEL<4> may maintain a sufficiently long deactivation period so that the predetermined period corresponding to each of the plurality of selection values SEL<1>, SEL<2>, SEL<3> and SEL<4> may be secured sufficiently. For reference, it may be seen that the predetermined order illustrated in FIG. 5 is an order in which the second selection value SEL<2> is activated subsequent to the first selection value SEL<1>, the third selection value SEL<3> is activated subsequent to the second selection value SEL<2>, the fourth selection value SEL<4> is activated subsequent to the third selection value SEL<3>, and the first selection value SEL<1> is activated again subsequent to the fourth selection value SEL<4>. However, the predetermined order illustrated in FIG. 5 is merely an embodiment, and in actuality, the selection values may be activated in a different order.

Figure 6A:
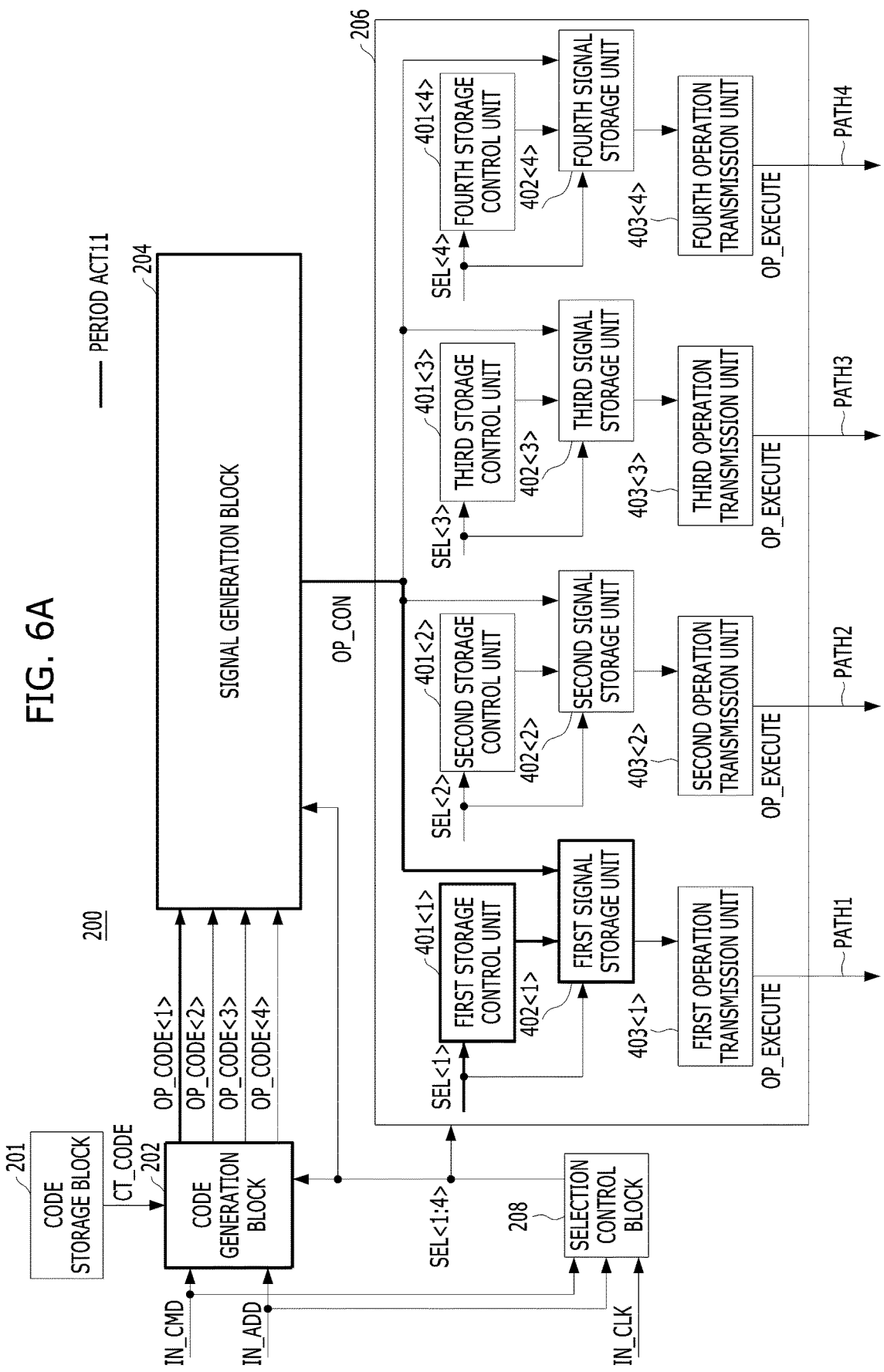
FIGS. 6A to 6C are diagrams illustrating characteristic operations of the control logic included in the memory device by combining the detailed configurations of the control logic illustrated in FIG. 3 with the operation of the control logic illustrated in FIG. 5 in accordance with an embodiment of the present disclosure.
Figure 6B:
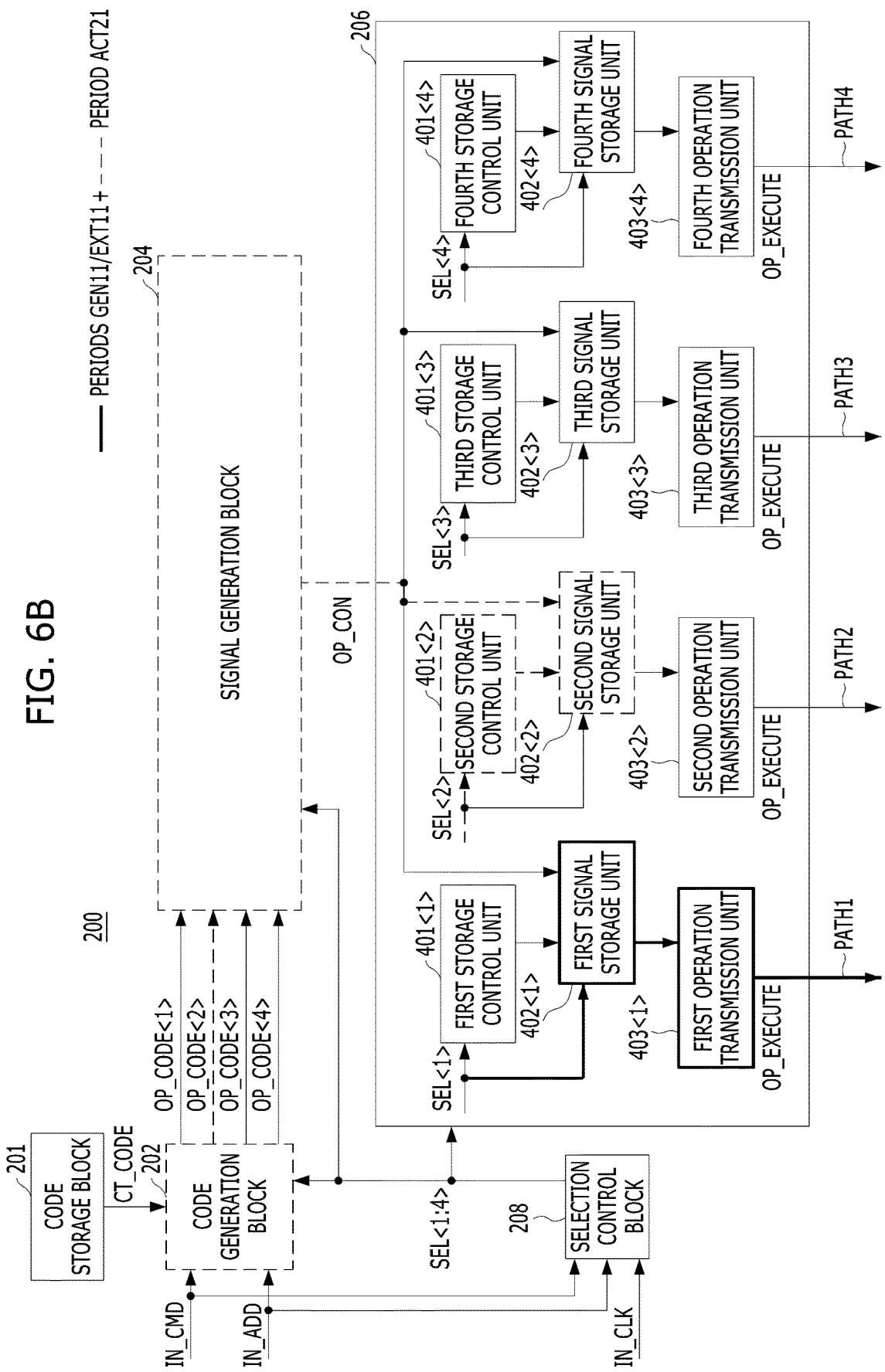
Figure 6C:
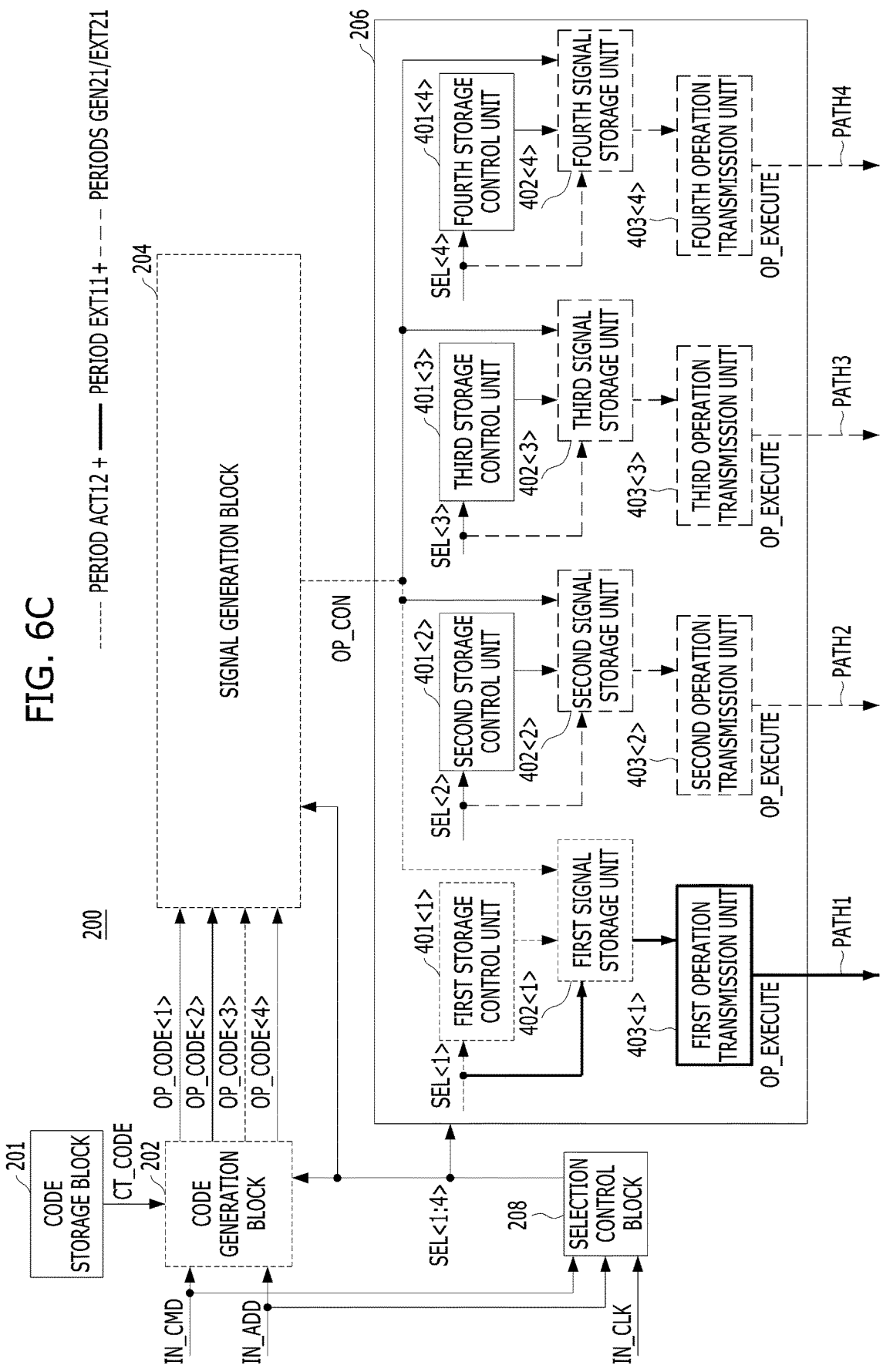

FIGS. 6A to 6C are diagrams illustrating characteristic operations of the control logic 200 included in the memory device 150 in accordance with an embodiment by combining the detailed configurations of the control logic 200 illustrated in FIG. 3 with the operation of the control logic 200 illustrated in FIG. 5 in accordance with an embodiment of the present disclosure.

Referring to FIG. 5 together with FIGS. 6A to 6C, it may be seen in what order the plurality of components 202, 204, 206, 208, 401<1:4>, 402<1:4> and 403<1:4> included in the control logic 200 operate according to the toggling of the input clock IN_CLK.

Referring to FIGS. 5 and 6A, the first selection value SEL<1> corresponding to the first plane 210 may be activated to the logic "high" level during the period between the point in time A and the point in time B. In this case, in FIG. 6A, it may be seen that components operating in response to the first selection value SEL<1> being activated to the logic "high" level during the period ACT11 between the point in time A and the point in time B are indicated by thick solid lines. For reference, since the selection control block 208 in FIG. 6A is a component for generating the plurality of selection values SEL<1>, SEL<2>, SEL<3> and SEL<4>, which are criterions for being enabled or not, the selection control block 208 is not indicated by a thick solid line.

The first control code OP_CODE<1> may be generated according to the input command IN_CMD and input address IN_ADD corresponding to the first plane 210 and being inputted and stored into the code generation block 202 before the point in time A.

The input command IN_CMD and input address IN_ADD corresponding to the first plane 210 may be inputted to the selection control block 208 before the point in time A, and the first selection value SEL<1> may be activated to the logic "high" level at the point in time A. The selection control block 208 may activate the first selection value SEL<1> at the point in time A, and then deactivate the first selection value SEL<1> at the point in time B subsequent to the point in time A. Since the first selection value SEL<1> is activated to the logic "high" level during the period between the point in time A and the point in time B, the other selection values SEL<2>, SEL<3> and SEL<4> may be deactivated to the logic "low" level. For reference, it may be seen in FIGS. 5 and 6A that the selection control block 208 sets a period in which the input clock IN_CLK toggles one time as the activation period of the first selection value SEL<1>, but this is merely an embodiment, and in actuality, the activation period of the first selection value SEL<1> may be set in a different way on the basis of the toggling of the input clock IN_CLK.

The signal generation block 204 may decode the first control code OP_CODE<1> received from the code generation block 202, and generate the operation control signal OP_CON during the period ACT11 in which the first selection value SEL<1> is activated to the logic "high" level between the point in time A and the point in time B.

The first storage control unit 401<1> may store the operation control signal OP_CON, which is generated by the signal generation block 204 during the period ACT11 in which the first selection value SEL<1> is activated to the logic "high" level between the point in time A and the point in time B, in the first signal storage unit 402<1>. Since the other selection values SEL<2>, SEL<3> and SEL<4> except for the first selection value SEL<1> are deactivated to the logic "low" level during the period ACT11 between the point in time A and the point in time B, the operation control signal OP_CON generated by the signal generation block 204 may not be stored in the other signal storage units 402<2:4> except for the first signal storage unit 402<1>.

Referring to FIGS. 5 and 6B, the second selection value SEL<2> corresponding to the second plane 230 may be activated to the logic "high" level during the period between the point in time B and the point in time C. It may be seen that the first selection value SEL<1> corresponding to the first plane 210 is deactivated to the logic "low" level at the point in time B, and then continuously maintains the deactivation state until the point in time C. In this case, it may be seen that components operating in response to the first selection value SEL<1> maintaining the deactivation state after being deactivated from the logic "high" level to the logic "low" level during the periods GEN11 and EXT11 between the point in time B and the point in time C are indicated by thick solid lines in FIG. 6B. In addition, it may be seen that components operating in response to the second selection value SEL<2> being activated to the logic "high" level during the period ACT21 between the point in time B and the point time C are indicated by dotted lines in FIG. 6B. For reference, since the selection control block 208 in FIG. 6B is a component for generating the plurality of selection values SEL<1>, SEL<2>, SEL<3> and SEL<4>, which are criterions for being enabled or not, the selection control block 208 is not indicated by a thick solid line or a dotted line.

The second control code OP_CODE<2> may be generated according to the input command IN_CMD and input address IN_ADD corresponding to the second plane 210 and being inputted and stored into the code generation block 202 before the point in time B. According to an embodiment, the code generation block 202 may generate the second control code OP_CODE<2> in response to the input command IN_CMD and input address IN_ADD corresponding to the second plane 210, and being applied and stored during the period between the point in time A and the point in time B. According to an embodiment, the code generation block 202 may generate the second control code OP_CODE<2> in response to the input command IN_CMD and input address IN_ADD corresponding to the second plane 210, and being applied and stored before the point in time A earlier than the point in time B.

Since the input command IN_CMD and input address IN_ADD corresponding to the first plane 210 are inputted to the selection control block 208 before the point in time A, the second selection value SEL<2> may be activated to the logic "high" level at the point in time B. The selection control block 208 may activate the second selection value SEL<2> at the point in time B, and then deactivate the second selection value SEL<2> at the point in time C subsequent to the point in time B. Since the second selection value SEL<2> is activated to the logic "high" level during the period between the point in time B and the point in time C, the other selection values SEL<1>, SEL<3> and SEL<4> may be deactivated to the logic "low" level. That is, the first selection value SEL<1> activated at the point in time A earlier than the point in time B may be deactivated at the point in time B in which the second selection value SEL<2> is activated. For reference, it may be seen in FIGS. 5 and 6B that the selection control block 208 sets a period in which the input clock IN_CLK toggles one time as the activation period of the second selection value SEL<2>, but this is merely an embodiment, and in actuality, the activation period of the second selection value SEL<2> may be set in a different way on the basis of the toggling of the input clock IN_CLK.

The signal generation block 204 may decode the second control code OP_CODE<2> received from the code generation block 202, and generate the operation control signal OP_CON, during the period ACT21 in which the second selection value SEL<2> is activated to the logic "high" level between the point in time B and the point in time C.

The second storage control unit 401<2> may store the operation control signal OP_CON, which is generated by the signal generation block 204 during the period ACT21 in which the second selection value SEL<2> is activated to the logic "high" level between the point in time B and the point in time C, in the second signal storage unit 402<2>. Since the other selection values SEL<1>, SEL<3> and SEL<4> except for the second selection value SEL<2> are deactivated to the logic "low" level during the period ACT21 between the point in time B and the point in time C, the operation control signal OP_CON generated by the signal generation block 204 may not be stored in the other signal storage units 402<1,3,4> except for the second signal storage unit 402<2>.

The first signal storage unit 402<1> may output the operation control signal OP_CON stored therein to the first operation transmission unit 403<1> during the periods GEN11 and EXT11 in which the first selection value SEL<1> is deactivated from the logic "high" level to the logic "low" level, and then maintains the deactivation state, between the point in time B and the point in time C. The first operation transmission unit 403<1> may generate the operation execution signal OP_EXECUTE according to the value of the operation control signal OP_CON outputted by the first signal storage unit 402<1> during the periods GEN11 and EXT11 in which the first selection value SEL<1> is deactivated from the logic "high" level to the logic "low" level, and then maintains the deactivation state, between the point in time B and the point in time C, and transmits the generated operation execution signal OP_EXECUTE to the first operation performing block 220 through the first path PATH<1>. The first operation performing block 220 may perform a predefined operation on the first plane 210 in response to the operation execution signal OP_EXECUTE inputted through the first path PATH<1>.

Referring to FIG. 5, the third selection value SEL<3> corresponding to the third plane 250 may be activated to the logic "high" level during the period between the point in time C and the point in time D. Since the third selection value SEL<3> is activated to the logic "high" level during the period between the point in time C and the point in time D, the other selection values SEL<1>, SEL<2> and SEL<4> may be deactivated to the logic "low" level.

The code generation block 202 may generate the third control code OP_CODE<3> in response to the input command IN_CMD and input address IN_ADD corresponding to the third plane 250, and being applied and stored during the period between the point in time B and the point in time C. In addition, the code generation block 202 may generate the third control code OP_CODE<3> in response to the input command IN_CMD and input address IN_ADD corresponding to the third plane 250, and being applied and stored before the point in time B earlier than the point in time C.

The signal generation block 204 may decode the third control code OP_CODE<3> received from the code generation block 202, and generate the operation control signal OP_CON during the period in which the third selection value SEL<3> is activated to the logic "high" level between the point in time C and the point in time D.

The third storage control unit 401<3> may store the operation control signal OP_CON, which is generated by the signal generation block 204 during the period in which the third selection value SEL<3> is activated to the logic "high" level between the point in time C and the point in time D, in the third signal storage unit 402<3>. Since the other selection values SEL<1>, SEL<2> and SEL<4> except for the third selection value SEL<3> are deactivated to the logic "low" level during the period between the point in time C and the point in time D, the operation control signal OP_CON generated by the signal generation block 204 may not be stored in the other signal storage units 402<1,2,4> except for the third signal storage unit 402<3>.

The first signal storage unit 402<1> may output the operation control signal OP_CON stored therein to the first operation transmission unit 403<1> during the periods GEN11 and EXT11 in which the first selection value SEL<1> is deactivated from the logic "high" level to the logic "low" level, and then maintains the deactivation state, between the point in time C and the point in time D. The first operation transmission unit 403<1> may generate the operation execution signal OP_EXECUTE according to the value of the operation control signal OP_CON outputted by the first signal storage unit 402<1> during the periods GEN11 and EXT11 in which the first selection value SEL<1> is deactivated from the logic "high" level to the logic "low" level, and then maintains the deactivation state, between the point in time C and the point in time D, and transmit the generated operation execution signal OP_EXECUTE to the first operation performing block 220 through the first path PATH<1>. The first operation performing block 220 may perform a predefined operation on the first plane 210 in response to the operation execution signal OP_EXECUTE inputted through the first path PATH<1>.

The second signal storage unit 402<2> may output the operation control signal OP_CON stored therein to the second operation transmission unit 403<2> during the periods GEN21 and EXT21 in which the second selection value SEL<2> is deactivated from the logic "high" level to the logic "low" level, and then maintains the deactivation state, between the point in time C and the point in time D. The second operation transmission unit 403<2> may generate the operation execution signal OP_EXECUTE according to the value of the operation control signal OP_CON outputted by the second signal storage unit 402<2> during the periods GEN21 and EXT21 in which the second selection value SEL<2> is deactivated from the logic "high" level to the logic "low" level, and then maintains the deactivation state, between the point in time C and the point in time D, and transmits the generated operation execution signal OP_EXECUTE to the second operation performing block 240 through the second path PATH<2>. The second operation performing block 240 may perform a predefined operation on the second plane 230 in response to the operation execution signal OP_EXECUTE inputted through the second path PATH<2>.

Referring to FIG. 5, the fourth selection value SEL<4> corresponding to the fourth plane 270 may be activated to the logic "high" level during the period between the point in time D and the point in time E. Since the fourth selection value SEL<4> is activated to the logic "high" level during the period between the point in time D and the point in time E, the other selection values SEL<1>, SEL<2> and SEL<3> may be deactivated to the logic "low" level.

The code generation block 202 may generate the fourth control code OP_CODE<4> in response to the input command IN_CMD and input address IN_ADD corresponding to the fourth plane 270, and being applied and stored during the period between the point in time C and the point in time D. In addition, the code generation block 202 may generate the fourth control code OP_CODE<4> in response to the input command IN_CMD and input address IN_ADD corresponding to the fourth plane 270, and being applied and stored before the point in time C earlier than the point in time D.

The signal generation block 204 may decode the fourth control code OP_CODE<4> received from the code generation block 202, and generate the operation control signal OP_CON during the period in which the fourth selection value SEL<4> is activated to the logic "high" level between the point in time D and the point in time E.

The fourth storage control unit 401<4> may store the operation control signal OP_CON, which is generated by the signal generation block 204 during the period in which the fourth selection value SEL<4> is activated to the logic "high" level between the point in time D and the point in time E, in the fourth signal storage unit 402<4>. Since the other selection values SEL<1>, SEL<2> and SEL<3> except for the fourth selection value SEL<4> are deactivated to the logic "low" level during the period between the point in time D and the point in time E, the operation control signal OP_CON generated by the signal generation block 204 may not be stored in the other signal storage units 402<1,2,3> except for the fourth signal storage unit 402<4>.

The first signal storage unit 402<1> may output the operation control signal OP_CON stored therein to the first operation transmission unit 403<1> during the periods GEN11 and EXT11 in which the first selection value SEL<1> is deactivated from the logic "high" level to the logic "low" level, and then maintains the deactivation state, between the point in time D and the point in time E. The first operation transmission unit 403<1> may generate the operation execution signal OP_EXECUTE according to the value of the operation control signal OP_CON outputted by the first signal storage unit 402<1> during the periods GEN11 and EXT11 in which the first selection value SEL<1> is deactivated from the logic "high" level to the logic "low" level, and then maintains the deactivation state, between the point in time D and the point in time E, and transmits the generated operation execution signal OP_EXECUTE to the first operation performing block 220 through the first path PATH<1>. The first operation performing block 220 may perform a predefined operation on the first plane 210 in response to the operation execution signal OP_EXECUTE inputted through the first path PATH<1>.

The second signal storage unit 402<2> may output the operation control signal OP_CON stored therein to the second operation transmission unit 403<2> during the periods GEN21 and EXT21 in which the second selection value SEL<2> is deactivated from the logic "high" level to the logic "low" level, and then maintains the deactivation state, between the point in time D and the point in time E. The second operation transmission unit 403<2> may generate the operation execution signal OP_EXECUTE according to the value of the operation control signal OP_CON outputted by the second signal storage unit 402<2> during the periods GEN21 and EXT21 in which the second selection value SEL<2> is deactivated from the logic "high" level to the logic "low" level, and then maintains the deactivation state, between the point in time D and the point in time E, and transmits the generated operation execution signal OP_EXECUTE to the second operation performing block 240 through the second path PATH<2>. The second operation performing block 240 may perform a predefined operation on the second plane 230 in response to the operation execution signal OP_EXECUTE inputted through the second path PATH<2>.

The third signal storage unit 402<3> may output the operation control signal OP_CON stored therein to the third operation transmission unit 403<3> during the period in which the third selection value SEL<3> is deactivated from the logic "high" level to the logic "low" level, and then maintains the deactivation state, between the point in time D and the point in time E. The third operation transmission unit 403<3> may generate the operation execution signal OP_EXECUTE according to the value of the operation control signal OP_CON outputted by the third signal storage unit 402<3> during the period in which the third selection value SEL<3> is deactivated from the logic "high" level to the logic "low" level, and then maintains the deactivation state, between the point in time D and the point in time E, and transmits the generated operation execution signal OP_EXECUTE to the third operation performing block 260 through the third path PATH<3>. The third operation performing block 260 may perform a predefined operation on the third plane 250 in response to the operation execution signal OP_EXECUTE inputted through the third path PATH<3>.

Referring to FIGS. 5 and 6C, the first selection value SEL<1> corresponding to the first plane 210 may be activated to the logic "high" level during the period between the point in time E and the point in time F. That is, the first selection value SEL<1> may be activated during the period ACT11 between the point in time A and the point in time B, be deactivated during the period DEACT11 between the point in time B and the point in time E, and be activated again during the period ACT12 between the point in time E and the point in time F. In this case, it may be seen that components operating in response to the first selection value SEL<1> being activated to the logic "high" level during the period ACT12 between the point in time E and the point in time F are indicated by short-dotted lines in FIG. 6C. It may be seen that components operating even after the first selection value SEL<1> is deactivated from the logic "high" level to the logic "low" level, maintains the deactivation state, and then is activated again to the logic "high" level during the period EXT11 between the point in time E and the point in time F are indicated by thick solid lines in FIG. 6C. It may be seen that components operating in response to the second selection value SEL<2> being deactivated from the logic "high" level to the logic "low" level and then maintaining the deactivation state during the periods GEN21 and EXT21 between the point in time E and the point in time F are indicated by long-dotted lines in FIG. 6C. It may be seen that components operating in response to the third selection value SEL<3> being deactivated from the logic "high" level to the logic "low" level and then maintaining the deactivation state during the period between the point in time E and the point in time F are indicated by long-dotted lines in FIG. 6C. It may be seen that components operating in response to the fourth selection value SEL<4> being deactivated from the logic "high" level to the logic "low" level and then maintaining the deactivation state during the period between the point in time E and the point in time F are indicated by long-dotted lines in FIG. 6C. For reference, since the selection control block 208 in FIG. 6C is a component for generating the plurality of selection values SEL<1>, SEL<2>, SEL<3> and SEL<4>, which are criterions for being enabled or not, the selection control block 208 is not indicated by a thick solid line or a long or short-dotted line.

The code generation block 202 may generate the first control code OP_CODE<1> again in response to the input command IN_CMD and input address IN_ADD corresponding to the first plane 210, and applied and stored therein before the point in time A. That is, the code generation block 202 may generate the first control code OP_CODE<1>, which is continuous with the first control code OP_CODE<1> during the period between the point in time A and the point in time B but has a different value, again during the period between the point in time E and the point in time F.

Since the input command IN_CMD and input address IN_ADD corresponding to the first plane 210 are inputted to the selection control block 208 before the point in time A, the first selection value SEL<1> may be activated to the logic "high" level at the point in time E. The selection control block 208 may activate the first selection value SEL<1> at the point in time E, and then deactivate the first selection value SEL<1> at the point in time F subsequent to the point in time E. Since the first selection value SEL<1> is activated to the logic "high" level during the period between the point in time E and the point in time F, the other selection values SEL<2>, SEL<3> and SEL<4> may be deactivated to the logic "low" level. That is, the fourth selection value SEL<4> activated at the point in time D earlier than the point in time E may be deactivated at the point in time E in which the first selection value SEL<1> is activated.

The signal generation block 204 may decode the first control code OP_CODE<1> received from the code generation block 202, and generate the operation control signal OP_CON, during the period ACT12 in which the first selection value SEL<1> is activated to the logic "high" level, between the point in time E and the point in time F.

The first storage control unit 401<1> may store the operation control signal OP_CON, which is generated by the signal generation block 204 during the period ACT12 in which the first selection value SEL<1> is activated to the logic "high" level, between the point in time E and the point in time F, in the first signal storage unit 402<1>. Since the other selection values SEL<2>, SEL<3> and SEL<4> except for the first selection value SEL<1> are deactivated to the logic "low" level during the period ACT12 between the point in time E and the point in time F, the operation control signal OP_CON generated by the signal generation block 204 may not be stored in the other signal storage units 402<2:4> except for the first signal storage unit 402<1>.

The first signal storage unit 402<1> may output the operation control signal OP_CON stored therein to the first operation transmission unit 403<1> during the period EXT11 in which the first selection value SEL<1> is activated again from the logic "low" level to the logic "high" level at the point in time E, and maintains the activation state until the point in time F. The first operation transmission unit 403<1> may generate the operation execution signal OP_EXECUTE according to the value of the operation control signal OP_CON outputted by the first signal storage unit 402<1> during the period EXT11 in which the first selection value SEL<1> is activated again from the logic "low" level to the logic "high" level at the point in time E, and maintains the activation state until the point in time F, and transmits the generated operation execution signal OP_EXECUTE to the first operation performing block 220 through the first path PATH<1>. The first operation performing block 220 may perform a predefined operation on the first plane 210 in response to the operation execution signal OP_EXECUTE inputted through the first path PATH<1>.

The second signal storage unit 402<2> may output the operation control signal OP_CON stored therein to the second operation transmission unit 403<2> during the periods GEN21 and EXT21 in which the second selection value SEL<2> is deactivated from the logic "high" level to the logic "low" level, and then maintains the deactivation state, between the point in time E and the point in time F. The second operation transmission unit 403<2> may generate the operation execution signal OP_EXECUTE according to the value of the operation control signal OP_CON outputted by the second signal storage unit 402<2> during the periods GEN21 and EXT21 in which the second selection value SEL<2> is deactivated from the logic "high" level to the logic "low" level, and then maintains the deactivation state, between the point in time E and the point in time F, and transmits the generated operation execution signal OP_EXECUTE to the second operation performing block 240 through the second path PATH<2>. The second operation performing block 240 may perform a predefined operation on the second plane 230 in response to the operation execution signal OP_EXECUTE inputted through the second path PATH<2>.

The third signal storage unit 402<3> may output the operation control signal OP_CON stored therein to the third operation transmission unit 403<3> during the period in which the third selection value SEL<3> is deactivated from the logic "high" level to the logic "low" level, and then maintains the deactivation state, between the point in time E and the point in time F. The third operation transmission unit 403<3> may generate the operation execution signal OP_EXECUTE according to the value of the operation control signal OP_CON outputted by the third signal storage unit 402<3> during the period in which the third selection value SEL<3> is deactivated from the logic "high" level to the logic "low" level, and then maintains the deactivation state, between the point in time E and the point in time F, and transmits the generated operation execution signal OP_EXECUTE to the third operation performing block 260 through the third path PATH<3>. The third operation performing block 260 may perform a predefined operation on the third plane 250 in response to the operation execution signal OP_EXECUTE inputted through the third path PATH<3>.

The fourth signal storage unit 402<4> may output the operation control signal OP_CON stored therein to the fourth operation transmission unit 403<4> during the period in which the fourth selection value SEL<4> is deactivated from the logic "high" level to the logic "low" level, and then maintains the deactivation state, between the point in time E and the point in time F. The fourth operation transmission unit 403<4> may generate the operation execution signal OP_EXECUTE according to the value of the operation control signal OP_CON outputted by the fourth signal storage unit 402<4> during the period in which the fourth selection value SEL<4> is deactivated from the logic "high" level to the logic "low" level, and then maintains the deactivation state, between the point in time E and the point in time F, and transmits the generated operation execution signal OP_EXECUTE to the fourth operation performing block 280 through the fourth path PATH<4>. The fourth operation performing block 280 may perform a predefined operation on the fourth plane 270 in response to the operation execution signal OP_EXECUTE inputted through the fourth path PATH<4>.

Particularly, the first storage control unit 401<1>, the first signal storage unit 402<1> and the first operation transmission unit 403<1> may simultaneously perform an operation of storing the operation control signal OP_CON generated by the signal generation block 204 in the first signal storage unit 402<1> during the period between the point in time E and the point in time F, an operation of outputting the operation control signal OP_CON stored in the first signal storage unit 402<1> to the first operation transmission unit 403<1>, and an operation of generating the operation execution signal OP_EXECUTE according to the value of the operation control signal OP_CON inputted from the first signal storage unit 402<1> and transmitting the generated operation execution signal OP_EXECUTE to the first operation performing block 220 through the first path PATH<1>. That is, some of the period ACT12 and the period EXT11 may overlap with each other. In this case, the value of the operation control signal OP_CON outputted by the first signal storage unit 402<1>, which the first operation transmission unit 403<1> uses to generate the operation execution signal OP_EXECUTE, may be a value which is being overwritten during the period between the point in time E and the point in time F (is being replaced with a value stored during the period between the point in time A and the point in time B) after being stored during the period between the point in time A and the point in time B by the first signal storage unit 402<1>. Such an operation may be performed because the operation control signal OP_CON in the first signal storage unit 402<1>, which is being overwritten during the period between the point in time E and the point in time F (is being replaced with a value stored during the period between the point in time A and the point in time B) after being stored during the period between the point in time A and the point in time B by the first signal storage unit 402<1>, is a continuous signal corresponding to the same input command IN_CMD and input address IN_ADD. Such an operation may be performed because the value of the operation control signal OP_CON stored in the first signal storage unit 402<1> during the period between the point in time A and the point in time B by the first signal storage unit 402<1> and the value of the operation control signal OP_CON stored in the first signal storage unit 402<1> during the period between the point in time E and the point in time F by the first signal storage unit 402<1> may have continuity therebetween.

Similarly, the second storage control unit 401<2>, the second signal storage unit 402<2> and the second operation transmission unit 403<2> may simultaneously perform an operation of storing the operation control signal OP_CON generated by the signal generation block 204 in the second signal storage unit 402<2> during the period between the point in time F and the point in time G, an operation of outputting the operation control signal OP_CON stored in the second signal storage unit 402<2> to the second operation transmission unit 403<2>, and an operation of generating the operation execution signal OP_EXECUTE according to the value of the operation control signal OP_CON inputted from the second signal storage unit 402<2> and transmitting the generated operation execution signal OP_EXECUTE to the second operation performing block 240 through the second path PATH<2>. That is, some of the period ACT22 and the period EXT21 may overlap with each other. In this case, the value of the operation control signal OP_CON outputted by the second signal storage unit 402<2>, which the second operation transmission unit 403<2> uses to generate the operation execution signal OP_EXECUTE, may be a value which is being overwritten during the period between the point in time F and the point in time G (is being replaced with a value stored during the period between the point in time B and the point in time C) after being stored during the period between the point in time B and the point in time C by the second signal storage unit 402<2>. Such an operation may be performed because the operation control signal OP_CON in the second signal storage unit 402<2>, which is being overwritten during the period between the point in time F and the point in time G (is being replaced with a value stored during the period between the point in time B and the point in time C) after being stored during the period between the point in time B and the point in time C by the second signal storage unit 402<2>, is a continuous signal corresponding to the same input command IN_CMD and input address IN_ADD. Such an operation may be performed because the value of the operation control signal OP_CON stored in the second signal storage unit 402<2> during the period between the point in time B and the point in time C by the second signal storage unit 402<2> and the value of the operation control signal OP_CON stored in the second signal storage unit 402<2> during the period between the point in time F and the point in time G by the second signal storage unit 402<2> may have continuity therebetween.

Like the first and second signal storage units 402<1:2> described above, since the third signal storage unit 402<3> also stores only the operation control signal OP_CON corresponding to the third plane 250, the operation control signal OP_CON outputted by the third signal storage unit 402<3>, which the third operation transmission unit 403<3> uses to generate the operation execution signal OP_EXECUTE during the period between the point in time G and the point in time H where the third selection value SEL<3> is activated for the second time, may be a value which is being overwritten during the period between the point in time G and the point in time H (is being replaced with a value stored during the period between the point in time C and the point time D) after being stored during the period between the point in time C and the point in time D by the third signal storage unit 402<3>.

Like the first and second signal storage units 402<1:2> described above, since the fourth signal storage unit 402<4> also stores only the operation control signal OP_CON corresponding to the fourth plane 270, the operation control signal OP_CON outputted by the fourth signal storage unit 402<4>, which the fourth operation transmission unit 403<4> uses to generate the operation execution signal OP_EXECUTE during the period between the point in time H and the point in time I where the fourth selection value SEL<4> is activated for the second time, may be a value which is being overwritten during the period between the point in time H and the point in time I (is being replaced with a value stored during the period between the point in time D and the point time E) after being stored during the period between the point in time D and the point in time E by the fourth signal storage unit 402<4>.

According to the embodiment of the present disclosure, an operation of a control logic for independently controlling each of a plurality of planes included in a memory device may be subdivided, and some of the subdivided operations may be performed in a form of being shared by the plurality of planes.

Accordingly, it is possible to minimize a physical area occupied in the control logic by components for controlling some operations that are shared by the plurality of planes, and furthermore, it is also possible to minimize a physical area occupied by the control logic in the memory device.

While the present disclosure has been illustrated and described with respect to specific embodiments and drawings, the disclosed embodiments are not intended to be restrictive. Further, it is noted that the present disclosure may be achieved in various ways through substitution, change, and modification, as those skilled in the art will recognize in light of the present disclosure, without departing from the spirit and/or scope of the present disclosure and the following claims. Furthermore, the embodiments may be combined to form additional embodiments.

What is claimed is:
1. A memory device comprising:
N planes each including a plurality of memory cells;
a signal generation block suitable for:
selecting a control code corresponding to N selection values from N control codes respectively corresponding to the N planes, and
generating an operation control signal by decoding the selected control code;

N operation performing blocks each suitable for performing a predefined operation on a corresponding plane of the N planes according to a value of the operation control signal;
a signal transmission block suitable for transmitting the operation control signal to one of the N operation performing blocks through a path corresponding to the N selection values among N paths that connect the signal generation block to the respective N operation performing blocks; and
a selection control block suitable for activating at each time an input clock becomes a predetermined logic level, one of the N selection values, while deactivating remaining N selection values,
wherein the signal transmission block includes:
N signal storage units;
N storage control units suitable for storing the operation control signal in the respective N signal storage units during activation periods of the respective N selection values; and
N operation transmission units suitable for:
generating an operation execution signal according to the value of the operation control signal outputted by the respective N signal storage units during a predetermined period after deactivation of the respective N selection values, and
transmitting the operation execution signal to the respective N operation performing blocks through the respective N paths, where "N" is a natural number equal to or greater than 2.

2. The memory device of claim 1, wherein:
the selection control block is enabled in response to an input command, an input address and the input clock being applied.

3. The memory device of claim 2, wherein the selection control block is disabled to deactivate all N selection values when the input command and input address are not applied for a predetermined number of toggles of the input clock after the selection control block is enabled.

4. The memory device of claim 2, wherein the selection control block is disabled to deactivate all N selection values in response to the input command directing the disabling of the selection block after the selection control block is enabled.

5. The memory device of claim 2, wherein:
the selection control block activates a first selection value among the N selection values at a first point in time, deactivates the first selection value at a second point in time later than the first point in time, maintains the first selection value in a deactivation state during a period between the second point in time and a third point in time, and sets a period between the second point in time and a fourth point in time later than the third point in time as the predetermined period corresponding to the first selection value, and
each of the first to fourth points in time is when the input clock becomes to have the predetermined logic level.

6. The memory device of claim 5, wherein:
a first storage control unit among the N storage control units stores the operation control signal in a first signal storage unit among the N signal storage units while the first selection value is activated,
the first signal storage unit outputs, during the predetermined period corresponding to the first selection value, the operation control signal to a first operation transmission unit among the N operation transmission units, and the first operation transmission unit generates, during the predetermined period corresponding to the first selection value, the operation execution signal to transmit the operation execution signal to a first operation performing block among the N operation performing blocks through a first path among the N paths.

7. The memory device of claim 6, wherein:
the selection control block activates a second selection value among the N selection values at the second point in time, deactivates the second selection value at a fifth point in time earlier than or equal to the third point in time, maintains the second selection value in the deactivation state during a period between the fifth point in time and the fourth point in time, and sets a period between the fifth point in time and a sixth point in time later than the fourth point in time as a predetermined period corresponding to the second selection value, and
each of the fifth and sixth points in time is when the input clock becomes to have the predetermined logic level.

8. The memory device of claim 7, wherein:
a second storage control unit among the N storage control units stores the operation control signal in a second signal storage unit among the N signal storage units while the second selection value is activated,
the second signal storage unit outputs, during the predetermined period corresponding to the second selection value, the operation control signal to a second operation transmission unit among the N operation transmission units, and
the second operation transmission unit generates, during the predetermined period corresponding to the second selection value, the operation execution signal to transmit the operation execution signal to a second operation performing block among the N operation performing blocks through a second path among the N paths.

9. The memory device of claim 2, further comprising:
a code storage block suitable for storing a plurality of operation source codes that are shared by the N planes; and
a code generation block suitable for:
reading the operation source code corresponding to the input command and the input address from the operation source codes in response to activation of the respective N selection values, and
selecting, from the N control codes, a control code corresponding to the operation source code corresponding to the input command and the input address.

10. The memory device of claim 9, wherein:
the plurality of operation source codes are classified according to a type of operations to be performed by the memory device, and
each of the plurality of operation source codes includes two or more sequential partial codes.

11. The memory device of claim 10, wherein:
the code generation block reads the operation source code by:
selecting, whenever one of the N selection values is activated, the operation source code corresponding to the input command and the input address in response to the activated selection value, and
sequentially reading, one by one, the partial codes included in the selected operation source code, and
the code generation block selects the control code corresponding to the operation source code corresponding to the input command and input address by selecting, from the N control codes, the control code corresponding to the input command and the input address in response to the activated selection value.

12. The memory device of claim 11, wherein the code generation block includes an internal storage space for storing K input commands and input addresses, where "K" is a multiple of "N".

13. The memory device of claim 12, wherein:
the code generation block is further suitable for storing, in the internal storage space, a first input command and a first input address corresponding to a first plane and a second input command and a second input address corresponding to a second plane among the N planes,
the code generation block selects a first operation source code from the plurality of operation source codes in response to the first input command and the first input address stored in the internal storage space, sequentially reads, one by one, the partial codes included in the first operation source code and selects a first control code among the N control codes whenever a first selection value among the N selection values is activated, and
the code generation block selects a second operation source code from the plurality of operation source codes in response to the second input command and the second input address stored in the internal storage space, sequentially reads, one by one, the partial codes included in the second operation source code, and selects a second control code among the N control codes whenever a second selection value among the N selection values is activated.

* * * * *